(12) United States Patent
Cockrell et al.

(10) Patent No.: US 11,599,697 B2
(45) Date of Patent: Mar. 7, 2023

(54) VIRTUAL EVALUATION FOR CIRCUITS AND SYSTEMS

(71) Applicant: Analog Devices, Inc., Norwood, MA (US)

(72) Inventors: Jason Cockrell, Norwood, MA (US); Thomas M. MacLeod, Clemmons, NC (US)

(73) Assignee: Analog Devices, Inc., Norwood, MA (US)

( * ) Notice: Subject to any disclaimer, the term of this patent is extended or adjusted under 35 U.S.C. 154(b) by 860 days.

(21) Appl. No.: 15/474,167

(22) Filed: Mar. 30, 2017

(65) Prior Publication Data

US 2017/0242950 A1    Aug. 24, 2017

Related U.S. Application Data

(63) Continuation-in-part of application No. 15/439,822, filed on Feb. 22, 2017, now Pat. No. 10,871,382.
(Continued)

(51) Int. Cl.
*G06F 30/30* (2020.01)
*G05B 19/042* (2006.01)
(Continued)

(52) U.S. Cl.
CPC ......... *G06F 30/30* (2020.01); *G05B 19/0426* (2013.01); *G06F 30/3308* (2020.01)

(58) Field of Classification Search
CPC .. G06F 17/5045; G06F 30/30; G06F 30/3308; G05B 19/0426; H04L 41/08;
(Continued)

(56) References Cited

U.S. PATENT DOCUMENTS 4,311,965 A    1/1982    Jones
5,170,333 A    12/1992   Niwayama
(Continued)

FOREIGN PATENT DOCUMENTS

CN    1842188 A    10/2006
CN    105210289 A   12/2015
(Continued)

OTHER PUBLICATIONS

CicuitLab: <https://web.archive.org/web/2016031034346/https://www.circuitlab.com/>, retrieved by Archive.org on Mar. 16, 2016. (Year: 2016).*
(Continued)

*Primary Examiner* — Eyob Hagos
(74) *Attorney, Agent, or Firm* — Schwegman Lundberg & Woessner, P.A.

(57) ABSTRACT

Various examples are directed to systems and methods for evaluating electronic components. A server computing device may provide an evaluation user interface to a user application executing at a user computing device. The server computing device may receive an indication of an electronic component for evaluation from the user application and via the user interface and access a configuration data set for the electronic component. The configuration data set may comprise argument data describing a set of arguments for the electronic component; binding data describing a relationship between a first argument of the set of arguments and a first model input parameter; and simulator data describing a model for the electronic component. The server computing device may also evaluate the electronic component based at least in part on the configuration data set.

19 Claims, 18 Drawing Sheets

Related U.S. Application Data

(60) Provisional application No. 62/315,380, filed on Mar. 30, 2016, provisional application No. 62/298,328, filed on Feb. 22, 2016.

(51) Int. Cl.
  *H04L 12/24* (2006.01)
  *H04L 29/08* (2006.01)
  *G06F 30/3308* (2020.01)

(58) Field of Classification Search
  CPC ......... H04L 67/02; H04L 41/14; H04L 67/36; H04L 67/10
  See application file for complete search history.

(56) References Cited

U.S. PATENT DOCUMENTS

| | | | |
|---|---|---|---|
| 5,918,194 A | 6/1999 | Banaska et al. | |
| 6,393,385 B1* | 5/2002 | Pawar | G06F 30/367 703/15 |
| 6,530,065 B1 | 3/2003 | McDonald et al. | |
| 6,532,436 B2 | 3/2003 | Molz | |
| 6,832,182 B1 | 12/2004 | Wilson, Jr. | |
| 7,626,272 B2 | 12/2009 | Kemerling et al. | |
| 7,890,079 B2 | 2/2011 | Behzad et al. | |
| 7,903,008 B2 | 3/2011 | Regier | |
| 8,041,314 B2 | 10/2011 | Vilhonen | |
| 8,044,716 B1 | 10/2011 | Loeb | |
| 8,054,208 B2 | 11/2011 | Fletcher et al. | |
| 8,373,586 B2 | 2/2013 | Alley et al. | |
| 8,878,570 B2 | 11/2014 | Thomsen | |
| 9,600,613 B1* | 3/2017 | Corbett | G06F 30/33 |
| 9,646,118 B1* | 5/2017 | Klair | G06F 30/20 |
| 9,798,840 B1* | 10/2017 | Ginetti | G06F 30/20 |
| 10,068,039 B1* | 9/2018 | Vennam | H05K 3/0005 |
| 10,255,403 B1* | 4/2019 | Saurabh | G06F 30/398 |
| 10,871,382 B2 | 12/2020 | Lyden et al. | |
| 2003/0036871 A1 | 2/2003 | Fuller, III et al. | |
| 2003/0036873 A1 | 2/2003 | Sierer et al. | |
| 2006/0086112 A1 | 4/2006 | Bloemer et al. | |
| 2006/0236303 A1 | 10/2006 | Wilson, Jr. et al. | |
| 2007/0239766 A1* | 10/2007 | Papaefstathiou | G06Q 10/04 |
| 2010/0030555 A1 | 2/2010 | Otani et al. | |
| 2011/0172979 A1* | 7/2011 | Bansal | G06F 30/33 703/4 |
| 2012/0194967 A1* | 8/2012 | Keane | G11C 13/0002 361/437 |
| 2014/0293663 A1 | 10/2014 | Ledezma et al. | |
| 2016/0066916 A1 | 3/2016 | Overmyer et al. | |
| 2016/0217237 A1* | 7/2016 | Kurosu | G06F 30/3312 |
| 2017/0147738 A1* | 5/2017 | Saraswat | G06F 30/367 |
| 2017/0241804 A1 | 8/2017 | Lyden et al. | |

FOREIGN PATENT DOCUMENTS

| | | |
|---|---|---|
| WO | WO-0122037 A1 | 3/2001 |
| WO | 2017173143 | 10/2017 |

OTHER PUBLICATIONS

Wikipedia: Spectral Density ,https://en.wikipedia.org/w/index.php?title=Spectral_density&oldid=660346818> page version captured at 1:17, May 2, 2015. (Year: 2015).*

Rouphael, Tony, Uniform Sampling of Signals and Automatic Gain Control (Dec. 31, 2009) downloaded from <https://www.researchgate.net/publication/301176172_Uniform_Sampling_of_Signals_and_Automatic_Gain_Control/citation/download> (Year: 2009).*

Wikipedia: Record (computer science): < https://en.wikipedia.org/w/index.php?title=Record_(computer_science)&oldid=706057729> (version Feb. 21, 2016) (Year: 2016).*

Wikipedia: Data Binding < https://en.wikipedia.org/w/index.php?title=Data_binding&oldid=705254256> (version Feb. 16, 2016) (Year: 2016).*

Intusoft SpiceMod, <https://web.archive.org/web/20160215171544/http://www.intusoft.com/spicemod.htm> retrieved by Archive.org on Feb. 15, 2016. (Year: 2016).*

Intusoft SpiceMod Model Spreadsheet Excerpt <http://www.intusoft.com/models/LibPW.zip> retrieved on Jan. 12, 2021. Spreadsheet dated Feb. 4, 2008. (Year: 2008).* https://en.wikipedia.org/w/index.php?title=Data_binding&oldid=705254256, version dated Feb. 16, 2016 (Year: 2016).*

"AnadigmApex dsASP Family User Manual", Anadigm, Inc. AN13x series, AN23x series, (2006), 36 pgs.

"U.S. Appl. No. 14/444,888, Non Final Office Action dated Mar. 21, 2019", 19 pgs.

"U.S. Appl. No. 15/439,822, Examiner Interview Summary dated Jul. 5, 2019", 3 pgs.

"U.S. Appl. No. 15/439,822, Final Office Action dated Oct. 31, 2019", 22 pgs.

"U.S. Appl. No. 15/439,822, Non Final Office Action dated Mar. 21, 2019", 18 pgs.

"U.S. Appl. No. 15/439,822, Response filed Jul. 22, 2019 to Non-Final Office Action dated Mar. 21, 2019", 14 pgs.

"Datasheet—Keysight Technologies M9295B PXIe Digital Stimulus/Response with PPME: 250 MHz, 16-channel", Keysight Technologies, (2016), 21 pgs.

"Parametric Measurement Unit and Supporting Components for ATE ApplicationsUsing the AD5522 PMU and the AD7685 16-Bit ADC", Analog Devices, Inc. Circuit Note, CN-0104, (2009), 4 pgs.

"Programmable IC delivers analog design", ApenCore, Inc., [Online], Retrieved from the Internet on Jun. 23, 2016: <URL: http://www.electronicproducts.com/Analog_Mixed_Signal_ICs/Programmable_IC_delivers_analog_design.aspx, (2016), 3 pgs.

Hassan, Mohammed F., "Field Programmable Analog Arrays: A Brief History", VLSI Egypt, [Online] Retrieved from the internet on Jun. 23, 2016: <URL: http://www.vlsiegypt.com/home/?p=1125>, (2016), 6 pgs.

Pankiewicz, Bogdan, et al., "A Field Programmable Analog Array for CMOS Continuous-Time OTA-C Filter Applications", IEEE Journal of Solid-State Circuits, 37(2), (Feb. 2002), 125-136.

"A Walkthrough of the Texas Instruments WEBENCH", [online], [retrieved on Feb. 8, 2017], Retrieved from the Internet: <URL: http://www.allaboutcircuits.com/news/an-introduction-to-the-texas-instruments-webench/>, (Aug. 6, 2016), 10 pgs.

"Motif Operational Simulator API", [online], (c) 1995-2015 Analog Devices, Inc. Retrieved from the Internet: <URL: https://wiki.analog.com/resources/technical-guides/motifapi>, (Mar. 25, 2016), 6 pgs.

"Renesas Smart Analog", [online]. (c) 2012 Renesas Electronics Corporation, Retrieved from the Internet: <URL: https://www.renesas.com/ko-kr/doc/products/smart_analog/r01pf0054ej0101_sa.pdf>, (2012), 4 pgs.

"Texas Instruments releases free WEBENCH PCT Tool", [online], [retrieved on Feb. 8, 2017], Retrieved from the Internet: <URL: http://www.automation.com/llbrary/resources/texas-instruments-releases-free-webench-pcb-tool>, (Jun. 10, 2014), 8 pgs.

"International Application Serial No. PCT/US2017/025141, International Search Report dated Jun. 2, 2017", 4 pgs.

"International Application Serial No. PCT/US2017/025141, Written Opinion dated Jun. 2, 2017", 6 pgs.

"International Application Serial No. PCT/US2017/025066, International Search Report dated Jun. 16, 2017", 4 pgs.

"International Application Serial No. PCT/US2017/025066, Written Opinion dated Jun. 16, 2017", 6 pgs.

"12-Bit, 2.6 GSPS/2.5 GSPS/2.0 GSPS, 1.3 V/2.5 V Analog-to-Digital Converter", Data Sheet AD9625, Rev. C, (c) 2014-2016 Analog Devices, Inc., (2016), 74 pgs.

Yepes, Alejandro G., "Analysis and Design of Resonant Current Controllers for Voltage-Source Converters by Means of Nyquist Diagrams and Sensitivity Function", IEEE Transactions on Industrial Electronics, 58(11), (2011), 5231-5250.

"U.S. Appl. No. 15/439,822, Response filed Mar. 30, 2020 to Final Office Action dated Oct. 31, 2019", 13 pgs.

(56) References Cited

OTHER PUBLICATIONS

"U.S. Appl. No. 15/439,822, Notice of Allowance dated Aug. 19, 2020", 16 pgs.
"European Application Serial No. 17717598.1, Communication Pursuant to Article 94(3) EPC dated Nov. 23, 2020", 14 pgs.
"High Speed, Digital to Analog Converters Basics", Application Report SLAA523A, (Oct. 1, 2012), 21 pgs.
Harris, Jonathan, "ADC Digital Downconverter: A Complex Decimation Example", Planetanalog, [Online] Retrieved from the Internet: <URL: https://www.planetanalog.com/adc-digital-downconverter-a-complex-decimation-example/#>, (Jan. 15, 2016), 6 pgs.
Pearson, Chris, "High-Speed, Analog-to-Digital Converter Basics", Texas Instruments Application Report SLAA510, (Jan. 31, 2011), 21 pgs.

\* cited by examiner

VIRTUAL EVALUATION FOR CIRCUITS AND SYSTEMS

CLAIM OF PRIORITY

This application claims the benefit of priority of U.S. Provisional Application Ser. No. 62/315,380, filed Mar. 30, 2016, and U.S. patent application Ser. No. 15/439,822, filed Feb. 22, 2017, which claims the benefit of priority to U.S. Provisional Application Ser. No. 62/298,328, filed Feb. 22, 2016 and the disclosure of which applications are herein incorporated by reference in their entirety.

BACKGROUND

Interfacing with many types of environmental sensors (e.g., temperature, vibration, acceleration, light, speed, sound, etc.) generally includes use of analog circuitry and mixed-signal circuitry for receiving and converting signals from the sensors to provide a discrete-time or digital representation. As the range of different available sensor types expands and as precision continues to improve, circuit designs capable of processing and converting signals from sensors are becoming increasingly more complex. Meanwhile, analog hardware design expertise is diminishing amongst application and system design engineers, with a focus instead being biased towards one or more of software or sensor expertise.

SUMMARY

Various examples are directed to systems and methods for evaluating electronic components. A server computing device may provide an evaluation user interface to a user application executing at a user computing device. The server computing device may receive an indication of an electronic component for evaluation from the user application and via the user interface and access a configuration data set for the electronic component. The configuration data set may comprise argument data describing a set of arguments for the electronic component; binding data describing a relationship between a first argument of the set of arguments and a first model input parameter; and simulator data describing a model for the electronic component. The model may reside at the server computing device or at a different location, as described herein. The server computing device may also evaluate the electronic component based at least in part on the configuration data set.

Additional examples are also disclosed, including method and machine-readable medium examples.

BRIEF DESCRIPTION OF THE FIGURES

In the drawings, which are not necessarily drawn to scale, like numerals may describe similar components in different views. Like numerals having different letter suffixes may represent different instances of similar components. The drawings illustrate generally, by way of example, but not by way of limitation, various example embodiments discussed in the present document.

DETAILED DESCRIPTION

Certain details are set forth below to provide a sufficient understanding of example embodiments of the disclosure. However, it will be clear to one skilled in the art that example embodiments of the disclosure may be practiced without various aspects of these particular details. In some instances, well-known circuits, control signals, timing protocols, computer system components, and software operations have not been shown in detail in order to avoid unnecessarily obscuring the described example embodiments of the disclosure.

The present inventors have recognized, among other things, that an erosion of analog or mixed-signal design expertise can result in increased design costs, schedule overruns, and can even impact end-product quality. For example, if a range of different conversion and signal processing devices are available for selection by a system engineer, the engineer may not have sufficient qualifications or tools available to make well-informed decisions regarding device selection or configuration of the device within the system including internal configuration or external support circuitry. Accordingly, use of a simulation tool can enable a user to evaluate a broad range of different devices and device configurations within the context of a particular sensing application in a "virtual" manner.

Examples of a virtual evaluation tool described herein may provide evaluation of selected circuit or system components and configurations based on received selection and configuration settings. Circuit and system design generally includes specifications of one or more system parameters such as in terms of sensor specifications (e.g., including one or more of sensed parameter range, environmental operating range or limitations, sensed parameter measurement accuracy, or sensed parameter measurement precision). The virtual evaluation tool may provide an interface that allows a user to select an electronic component (also called a component). Examples of components may include electronic devices, circuits, systems, etc. The virtual evaluation tool may also provide the interface to set or select configurations for the selected component. The virtual evaluation tool may further provide a stimulus signal (e.g., a selected waveform or an input signal having specified characteristics) to the selected component such as to provide evaluation data indicative of a behavioral response to the provided signal. The evaluation data may be used to determine whether the selected component meets the needs of the user.

Figure 1:
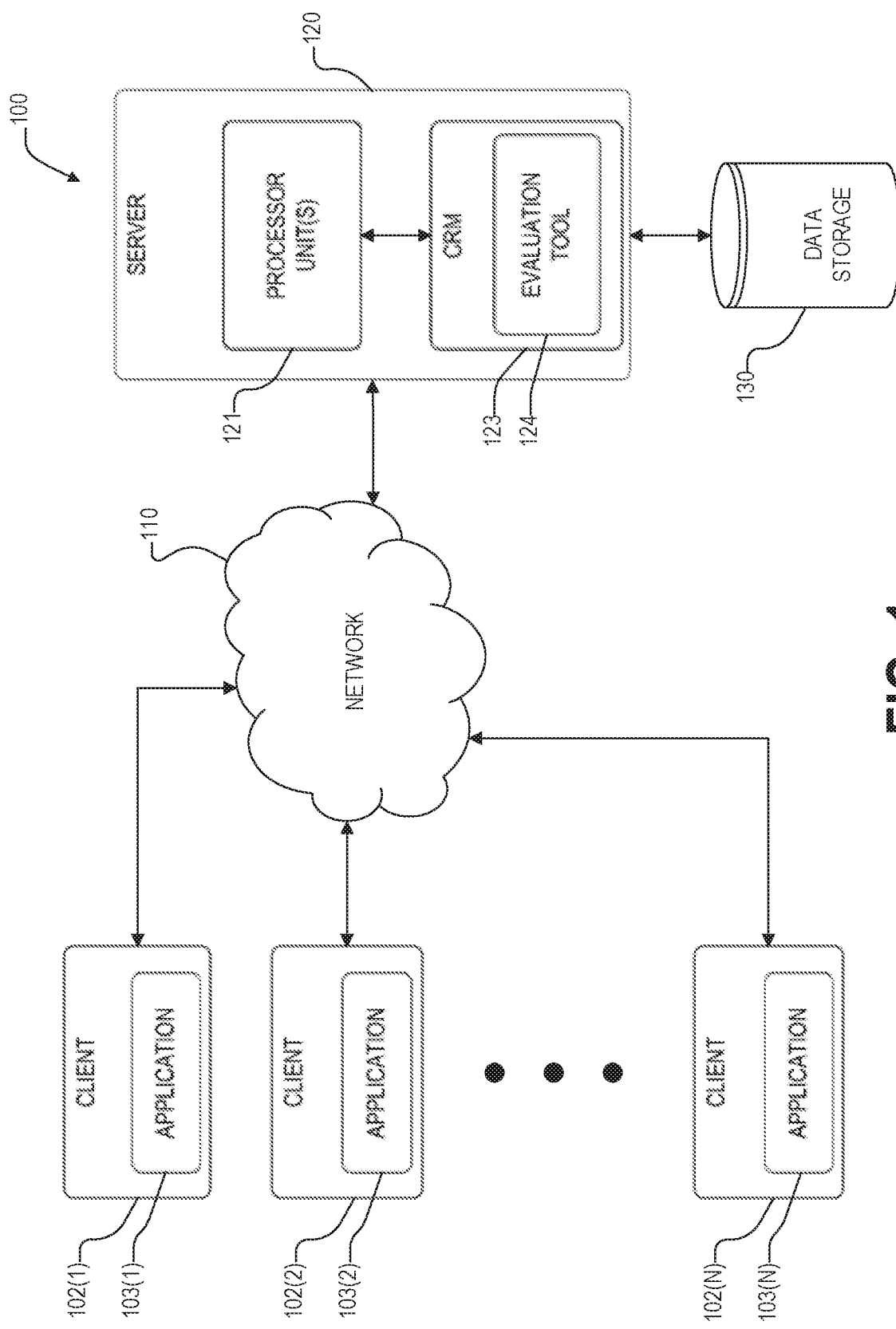
FIG. 1 illustrates an environment according to an example embodiment of the disclosure.

FIG. 1 illustrates an environment 100, according to an example embodiment of the disclosure. The environment 100 may include a server 120 that may have an evaluation tool 124 that provides, to a client 102(1-N), behavioral models for a selected component or components responsive to receiving a stimulus signal. The client 102(1-N) may be or include any suitable computing device including, for example, a desktop computer, a laptop computer, a workstation, a mobile device, a tablet, etc. The evaluation tool 124 may provide the behavior models to the client 102(1-N) in response to receiving selection of at least one of the component or configuration from the client 102(1-N). Respective clients 102(1-N) may include at least one computer readable medium encoded with executable instructions that may be executable by one or more processing units of the client 102(1-N) for transmitting, receiving, encoding, and/or decoding data from the server 120, such as an application 103(1-N) on the respective client 102(1-N). In some examples, the application 103(1-N) may include a web-based application for transmitting, receiving, encoding, or decoding data from sensors 104(1-M) or the server 120. For example, the application 103(1-N) may execute in or through a web browser application. In some examples, the application 103(1-N) may include another, non-web-based application for transmitting, receiving, encoding, and/or decoding data from sensors or the server 120.

Respective clients 102(1-N) may be coupled to a network 110 to provide one or more of component or configuration selections to the server 120 and to receive evaluation data from the server 120. The network 110 may be implemented using one or more networks, such as, but not limited to, local area networks (LANs), wide area networks (WANs), metropolitan area networks (MANs), cellular networks, and/or the Internet. Communications provided to, from, and within the network 110 may be wired and/or wireless, and further may be provided by any networking devices known in the art, now or in the future. Devices communicating over the network 110 may communicate with any communication protocol, including, but not limited to, TCP/IP, UDP, RS-232, and IEEE 802.11, Long-Term Evolution (LTE) or LTE advanced wireless communication, or any other cellular/wireless communication standard.

The server 120 may provide, process, and/or communicate with interfaces, modules, and/or circuits to evaluate selected components and configurations received from a client, and provide the evaluation data to the client. The server 120 may include one or more processor units 121 and computer readable media 123. The computer readable media 123 may encode instructions for executing the evaluation tool 124, which may include a client communication interface, a signal generator, a data analyzer module, etc. For example, the instructions for the evaluation tool 124 may cause the one or more processor units 121 to receive a request to evaluate selected components having selected configurations from a client of the clients 102(1-N), and, in response to the request, to run a simulation using a generated signal and providing evaluation data to the requesting client. The server may be capable of executing multiple instances of the instructions for the evaluation tool 124 to respond to multiple contemporaneous requests from a single client, multiple different clients, or combinations thereof. The server 120 may provide one or more of component lists or user-adjustable configuration options to the user. The component lists and user-adjustable configuration options may be stored in one or more databases that are accessible to the server 120. For example, the database may be stored in data storage 130.

In operation, a client of the clients 102(1-N) may start the respective application 103(1-N) to engage the server 120 for execution of the instructions for the virtual evaluation tool 124. For example, the client may navigate to a website that is directed to the server 120 to request access to the evaluation tool 124. The server 120 may provide a list of component options to the requesting client and may receive a selection of one or more components from the list of components. In some examples, the list of components may include analog circuit components, such as digital-to-analog converters (DACs), ADCs, filters or other signal conditioning circuitry, etc. In other examples, the selection of the component may be from another application running on the server 120 based on a previous selection by the client.

A component evaluated by the evaluation tool 124 may include a discrete device and/or a chain or other arrangement of devices. A discrete device may include, for example, a DAC, an ADC, a filter, a sensor, a transistor, etc. Chains of discrete devices, referred to herein as signal chains, may include examples of discrete devices in communication with one another to process a stimulus signal. For example, a component may include systems, circuits, devices, etc. as described herein. Signal chain data, describing a signal chain to be evaluated, in some examples, is received from a user via the UI 364.

Responsive to receipt of selection of the component, the evaluation tool 124 may provide user-adjustable configuration options for the component to the requesting client. The user-adjustable configuration options may correspond to configuration settings available for the one or more components (e.g., clock rate, external jitter, whether one or more features, such as a digital down-converter (DDC), are enabled). Configuration options available for a particular component may be described by a configuration data set stored in a configuration file database, such as at the data storage 130. A configuration data set may be or include any suitable logical unit of data such as, for example, a file. An evaluation may also include feeding a stimulus signal to the component. The server 120 may also provide user-defined configuration options for a signal generator to provide the data signal, such as a signal type (shape), frequency, amplitude, etc. In some examples, the input signal configuration options may be retrieved from a database, such as the configuration file database.

Responsive to receiving the selected configurations, the evaluation tool 124 may run an evaluation, for example, by providing a generated stimulus signal (based on received configuration selections) to a model of the component to provide evaluation output data. The evaluation of the component may be based on information corresponding to the component retrieved from a product database and/or configuration options for the component received from the client 102(1-N). The evaluation tool 124 may implement a signal chain to run the simulation, including the signal generator, one or more simulators, and one or more data analyzers. The evaluation tool 124 may provide the evaluation output data to the requesting client 102(1-N), for example, via a user interface implemented by the application 103(1-N). In some examples, the requesting client 102(1-N) may adjust one or more of the configuration options and provide a request to perform the evaluation again.

Figure 2:
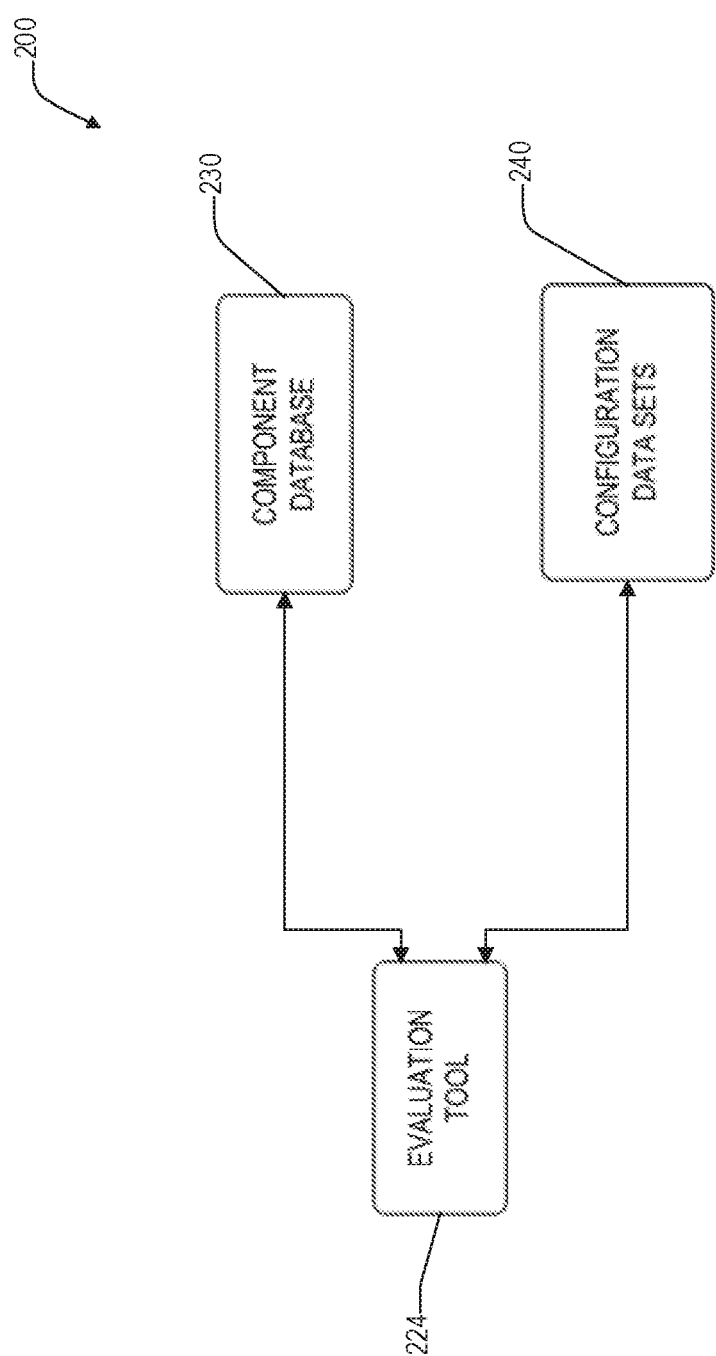
FIG. 2 illustrates an evaluation system, according to an example embodiment of the disclosure.

FIG. 2 illustrates an evaluation system 200, according to an example embodiment of the disclosure. For example, the evaluation system 200 may illustrate one example implementation and/or use of the evaluation tool 124 of the environment 100. The system 200 may include an evaluation tool 224 configured to perform a virtual evaluation based on data from a component database 230 and configuration data sets 240. The evaluation tool 224 may be implemented in the server 120 of FIG. 1. The component database 230 and/or the configuration data sets 240 may be implemented in the server 120 and/or the data storage 130 of FIG. 1.

FIGS. 11-15, described in more detail herein, depict various example screen shots showing an evaluation screen 1100 associated with the evaluation tool. The evaluation screen 1100 is an example and is not intended to be limiting. In some examples, the evaluation tool 224 may run as a web-based application using a collection of dynamic-link libraries (DLLs) a server, such as the server 120. For example, the DLLs may include an active functional model, a Modeling Operation Through Implementation of Features (MOTIF) DLL, and a Virtual Eval DLL. The DLLs may be coded using C# or C++, for example. The MOTIF DLL may include an application program interface (API) that receives one or more component model files that correspond to the selected component from a component database, and may run a simulation of the selected components using corresponding component model files.

The evaluation tool 224 may rely on the component database 230 and the configuration data sets 240. The component database 230 may be stored in any suitable format, such as the eXtensible Markup Language (XML) format. The data from the component database may be loaded into the MOTIF DLLs to enable simulation of high-speed components. The configuration data sets 240, which may be stored in the XML format, may be loaded into or by components of the evaluation tool 224 (e.g., a DLL or other similar component) to configure a user interface for respective products. The configuration data sets 240 may also be used by the Virtual Eval DLL to configure detailed structural relationships between the user interface and underlying simulations.

The evaluation tool 224 may interface with a client (e.g., a client of the clients 102(1-N) of FIG. 1) running in a browser. Client-side software may be written in a React JavaScript framework, in some examples. Additional functionality may be provided by an open-source graphing library called D3. The virtual evaluation tool 224 may provide a client with a list of components from the configuration data sets 240. The list of components may be separated into categories, in some examples. In some examples, the list of components may be or include a diagram of a product, such as a chip or module. The diagram may include one or more highlighted components. In some examples, the highlighting of the diagram may change to emphasize the currently-selected component. In some examples, the evaluation tool 224 may present links to print an evaluation session, navigate to data sheets, navigate to a product page, or purchase equipment associated with the component, such as depicted in the screen capture image 800 of FIG. 8.

A component supported by the evaluation tool 224 may be associated with a unique configuration data set of the configuration data sets 240. A configuration data set 240 for a component may include various data describing the component such as, for example, a layout for all or part of a user interface for receiving user configuration settings, relationships between settings, results, and simulations, etc. These interface and structural relationships are used by the evaluation tool 224 to perform an evaluation. The configuration data set 240, in some examples, is generated or encoded in XML, and the files may include several sections, such as Args, Bindings, Bundles, Generators, Simulators, Analyses, Evaluations, and Pages. A section may include one or more elements. An element of the configuration may correspond to an instance of an object outlined in software. When the virtual evaluation tool 224 initializes a session, it reads a configuration file for the appropriate product and creates the various associated instances of the specified objects.

Figure 3:
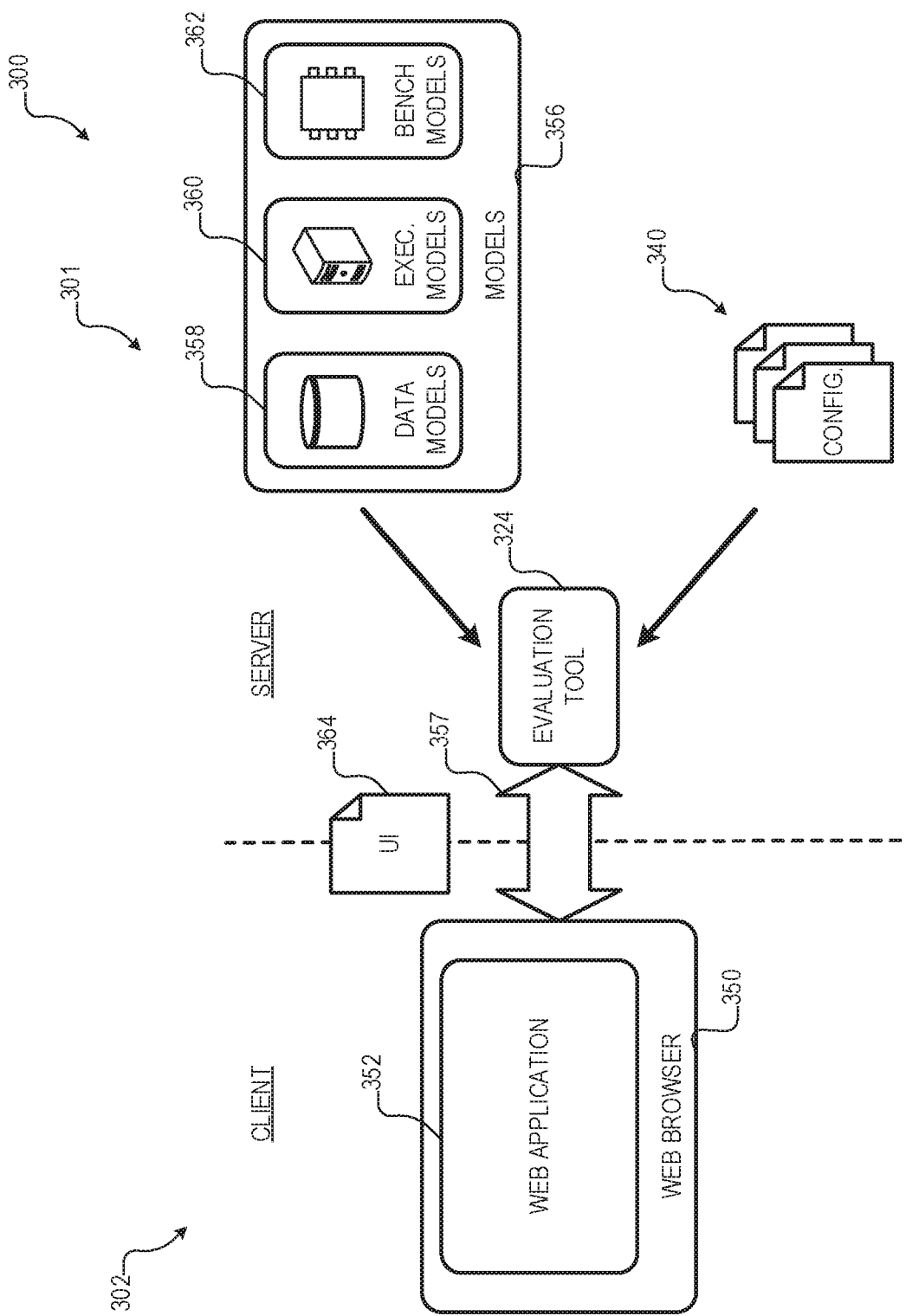
FIG. 3 is a diagram showing another example embodiment of an environment, according to an example embodiment of the disclosure.

FIG. 3 is a diagram showing another example embodiment of an environment 300, according to an example embodiment of the disclosure. The environment 300 comprises a client 302 and a server-side 301. The client 302 may operate in a manner similar to that described herein with respect to the clients 102 (1-N). For example, the client 302 may execute a web browser application 350. Any suitable web browser application 350 may be used such as, for example, Internet Explorer™ by Microsoft Corporation, Microsoft Edge® by Microsoft Corporation, Firefox® by the Mozilla Foundation, Chrome by Google, Inc., etc. A web application 352 may execute in or through the web browser application 350. For example, the web browser application 350 and/or web application 352 may execute the operations of the application 103(1-N) of FIG. 1. The web application 352 may generate and/or populate a user interface (UI) 364, which may be displayed at a screen or other input/output (I/O) device of the client 302.

The server-side 301 may include an evaluation tool 324 that may operate in a manner similar to that described herein with respect to the evaluation tools 124, 224. For example, the evaluation tool 324 may execute at one or more servers, such as the server 120 of the environment 100. The evaluation tool executable 324 may be in communication with the web application 352, for example, to receive argument values through the UI 364 and/or provide evaluation output data or other data for populating the UI 364 via communication link 357. The communication link 357 may be or be conducted over a network, similar to the network 110 of FIG. 1. In some examples, the communication link 357 may be implemented using asynchronous JavaScript and XML (AJAX) programming techniques, though any suitable techniques may be used. In some examples, the evaluation tool 324 may include multiple executables and/or DLLs that may execute together to implement the operations of the evaluation tool described herein.

The evaluation tool 324 may be in communication with one or more models 356. Models 356 are shown on the server-side 301 and may be implemented or executed at the same server that executes the evaluation tool 324 and/or at a different computing device. Any suitable type of model may be used. For example, a data model 358 may describe the response of an electronic component for modeling to different stimulus signals at a database, table, or other suitable data structures. The evaluation tool 324 may query a data model 358 to retrieve data describing the response of the modeled component to various pre-simulated stimulus signals. Executable models 360 may be algorithmic models executed by a server or other suitable computing device. Examples of executable models include, for example, Simulation Program with Integrated Circuit Emphasis (SPICE) models, and MOTIF models, such as the ADIsimADC and ADIsimDAC models available from Analog Devices, Inc.

In some examples, the evaluation tool 324 may also be in communication with one or more bench models 362. A bench model 362 may be a "hardware-in-the-loop" model where a physical model circuit including the component to be modeled is provided with a stimulus signal and its response is measured. For example, a bench model 362 may be implemented in a physical lab facility that may be remote from the client 302 and/or from the server or other computing device executing the evaluation tool 324. A computing device at the lab facility may receive data describing a desired stimulus signal, prompt equipment at the lab facility to generate the stimulus signal, and provide the stimulus signal to a physical example of the modeled component. The computing device at the lab facility may also capture a response of the component and send the captured response back to the evaluation tool 324.

The evaluation tool 324 may initiate a model 356 during an evaluation. For example, the evaluation tool 324 may initiate an executable model 360 by causing the executable model 360 to execute at the server executing the evaluation tool 324 and/or by requesting that another computing device execute the executable model 360. The evaluation tool 324 may initiate a data model 358 by accessing a data store or other storage location including the data making up the data model 358. The evaluation tool may initiate a bench model 362, for example, by requesting that a computing device at the lab facility execute the bench model 362, for example, as described herein.

The evaluation tool 324 may also be in communication with one or more configuration data sets 340. Configuration data sets 340, as described in more detail with respect to FIG. 4 herein, may include various metadata for facilitating the simulation of a component utilizing one or more of the models 356. In some examples, each component that may be evaluated by the evaluation tool 324 may be associated with a configuration data set 340. In some examples, a single configuration data set 340 may describe any sort of component including, for example, a signal chain as described herein.

Figure 4:
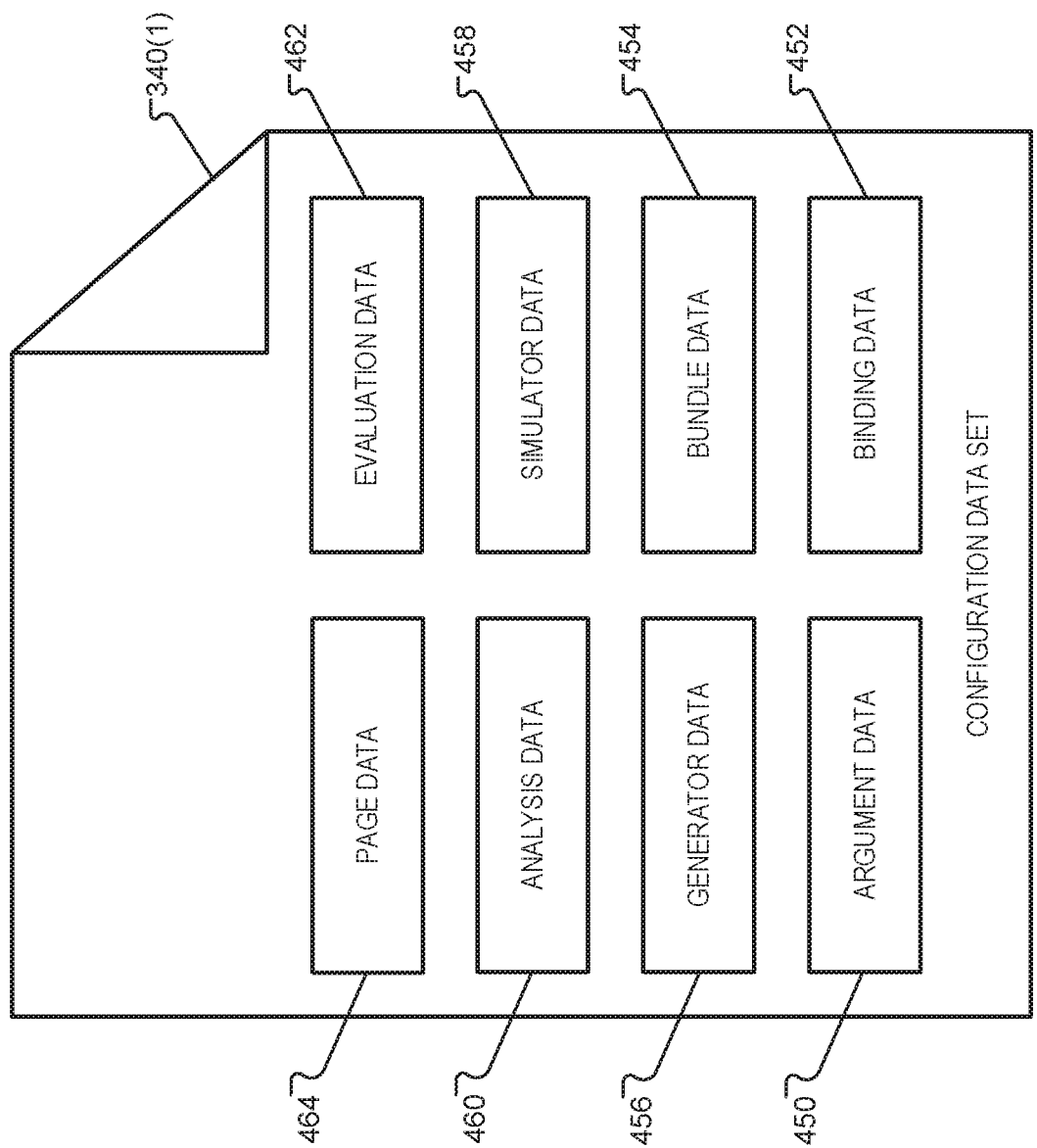
FIG. 4 is a diagram showing one example embodiment of a configuration data set.

FIG. 4 is a diagram showing one example embodiment of a configuration data set 340(1). For example, the configuration data set 340(1) may be one of the configuration data sets 340 illustrated in FIG. 4. The configuration data set 340(1) may include argument data 450, binding data 452, bundle data 454, generator data 456, simulator data 458, analysis data, 460, evaluation data 462, and page data 464.

Argument data 450 may describe arguments that may be used, as described herein, to interface between the user (e.g., operating a client 102(1-N)) and one or more models 356. An argument, or arg, may be any value (e.g., a custom value) used in the evaluation tool 324, such as a user-defined setting or a performance result, such as together with associated metadata. Arguments may have various properties described by metadata that may be a part of the argument data 450. Example argument properties include a type, such as floating point, integer, Boolean, etc., and a unique name for the argument. Other example argument properties include a displayed name, unit information, minimum and maximum allowed values, etc. The argument data 450 of the configuration data set 340(1) may limit enumeration of data and metadata to the arguments to be used in the evaluation session, but does nothing actionable within.

Argument data 450 may include data (e.g., metadata) describing different arguments that are used by the evaluation tool 424. For example, argument data 450 describing a particular argument may indicate a type of the argument. Example argument types may include floating point, integer, string, Boolean, enumerable, etc. Argument data 450 describing a particular argument may also include a limits object that describes a set of allowable values. Limits can take the form of a minimum, maximum, or minimum-maximum pair, a discrete set of allowed values, or no restrictions. When a value is assigned to an argument, the evaluation tool 424 or other suitable component may check the validity of the received value against the limits, if any, described by the argument data.

In some examples, arguments described by argument data 450 provide a common format for receiving input parameters for models 356. For example, arguments, as described herein, may allow the UI 364 to provide and/or request simulation input parameters from the user in the form of a consistent way regardless of the underlying simulator(s), generator(s), evaluation(s), or analysis or analyses used. Example argument data 450 is shown below. In the example argument data 450, a floating-point argument with no limits and a string argument with the discrete set of allowed options "FS" and "ODR" are initialized.

```
<Args>
    <Float Name="vStart" DisplayName="Start Voltage" Unit="V"
    Value="0.001" />
    <Toggle Name="fsOrODR" DisplayName="Control FS or ODR"
    Value="FS">
        <Option>FS</Option>
        <Option>ODR</Option>
    </Toggle>
</Args>
```

In the example, the argument vStart provides an argument name, an argument value, and an argument selection, fsOrODR. FsOrODR may indicate whether the start voltage is to have a specified output data rate (ODR) or a specified filter. Note that this example argument data 450 is an example and not intended to be limiting.

Binding data 452 may describe bindings, or relationships between arguments (e.g. arguments described by the argument data 450). A binding may be a directed relationship between one or more source arguments (also called sources) and one or more destination arguments (also called destinations). One example binding directly relates a first argument, ArgA, to a second argument, ArgB. In this example binding, the value of ArgB tracks the value of ArgA such that when the value of ArgA changes, the value of ArgB is set to the same. In some example bindings, several arguments could be mathematically joined (e.g., algebraically joined) through a formula. In another example binding, one argument ArgC may be set to the square root of the sum of the squares of two other arguments, ArgA and ArgB.

A binding may express a mathematical relationship between arguments in any suitable format, such as, for example, a Reverse Polish Notation scheme. In some examples, a binding may be conditional or scenario-based. For example, a conditional binding may describe a relationship between arguments that is true under some conditions and false under other conditions. The condition or conditions of a conditional binding may be met if an argument or set of arguments are set to certain values, but not at other times.

Below is example binding data 452 showing two example bindings. The first binding includes a constraint that an argument called 4800OverODR be equal to 4800 divided by the value of the argument odr. The second binding is a conditional binding indicating that fsInterntal will be set to the value of fsbits if fsOrODR has the value 'FS', but will be set to the value of 4800OverODR if fsOrODR has the value 'ODR'.

```
<Bindings>
    <Binding RPN="4800 @odr /" Destination="4800OverODR" />
    <Binding Toggle="fsOrODR" Destination="fsInternal">
        <Case Value="FS" Source="fsbits" Destination="fsInternal" />
        <Case Value="ODR" Source="4800OverODR" Destination="fsInternal" />
    </Binding>
</Bindings>
```

In some examples, bindings, as described herein, may allow the evaluation tool 324 to translate information between the UI 364 and the models 356 in an efficient and/or consistent manner. For example, different models 356 may expect different sets of input parameters, specified in different ways, such as in different units, etc. Bindings, described by the binding data 452, may relate one or more arguments received from and/or provided to a user via the UI 364 to one or more other arguments representing input parameters to specific models 356. For example, bindings may ensure that one set of user-defined settings maps to input parameters of various models 356. For example, a particular model, generator, evaluation, or analysis may expect to receive a start voltage expressed in millivolts (mV). On the other hand, an argument may provide a start voltage in volts. A binding may transform the argument to the input expected by the simulator, generator, evaluation, or analysis. In another example, when a model 356 returns performance results, bindings map those results back to user-friendly formats for delivery.

In some examples, the binding data 452 may include any suitable number of bindings having any suitable depth. In graph theoretic terms, the bindings which determine the value of an argument may be represented as a tree directed toward the root, an anti-arborescence. This may be useful for devices whose configuration information fundamentally changes when a feature such as digital down-conversion or numerically-controlled oscillation is enabled or disabled.

Bundle data 454 describes bundles. A bundle may describe a grouping of inputs and/or outputs that are to appear, for example, at a common region of the UI 364. For example, in the example evaluation screen 1100 shown in FIGS. 12-14, a bundle may describe the inputs and/or outputs that appear in a settings column, including fields 1120, 1122, 1124, shown on a left side of the evaluation screen 1100. The contents of a bundle generally include arguments, for example, described by the argument data 450. A bundle may be empty; for instance, a bundle for enabling an external RC circuit may cause the UI 364 to display inputs and/or outputs pertaining to that feature. When the external RC circuit feature is disabled, the bundle may similarly be disabled and the display may display no inputs or outputs. Example bundle data 454 below demonstrates two bundles. A first, called "extEnabled," shows that a "resistance" input and a "capacitance" input are to be displayed. A second, called "extDisabled," shows a null set of inputs and/or outputs to be displayed, for example, when an RC circuit feature is disabled.

```
<Def Name="COMMON-BUNDLES">
    <Bundle Name="extEnabled">
        <Arg Name="resistance" />
        <Arg Name="capacitance" />
    </Bundle>
    <Bundle Name="extDisabled" />
</Def>
```

Generator data 456 may describe one or more generators that may be utilized to generate one or more stimulus signals for a model including the component described by the configuration data set 340(1). A generator may specify a stimulus signal according to a defined pattern (e.g., a single-tone sine wave, etc.). Any suitable generator may be used. In some examples, generator data 456 may describe generator input parameters. Example generator data 456 below describes a two-tone generator:

```
<Generators>
    <TwoTone Name="TwoTone">
        <Binding Source="amp1" Destination="amplitude1" />
        <Binding Source="freq1" Destination="frequency1" />
        <Binding Source="amp2" Destination="amplitude2" />
        <Binding Source="freq2" Destination="frequency2" />
    </TwoTone>
</Generators>
```

Simulator data 458 may describe one or more simulators. A simulator may wrap a model 356. For example, a simulator may include metadata describing model input parameters, for example, in terms of arguments and/or bindings (e.g., described by argument data 450 and/or binding data 452). A simulator may also include metadata for translating a stimulus signal generated by a generator to a format expected by a model 356. Analysis data 460 may describe one or more analyses that may be performed on the output of a model 356. For example, an analysis may receive output data from a model 356 and generate evaluation data, which may take the form of graphs and performance metrics.

Examples of analyses may include an X-Y graph analysis that generates evaluation data describing a voltage, current, power, or other parameter of a model output in the time domain, a Fourier transform analysis, such as a FFT that generates evaluation data describing a frequency content of a model output, etc.

Figure 13:
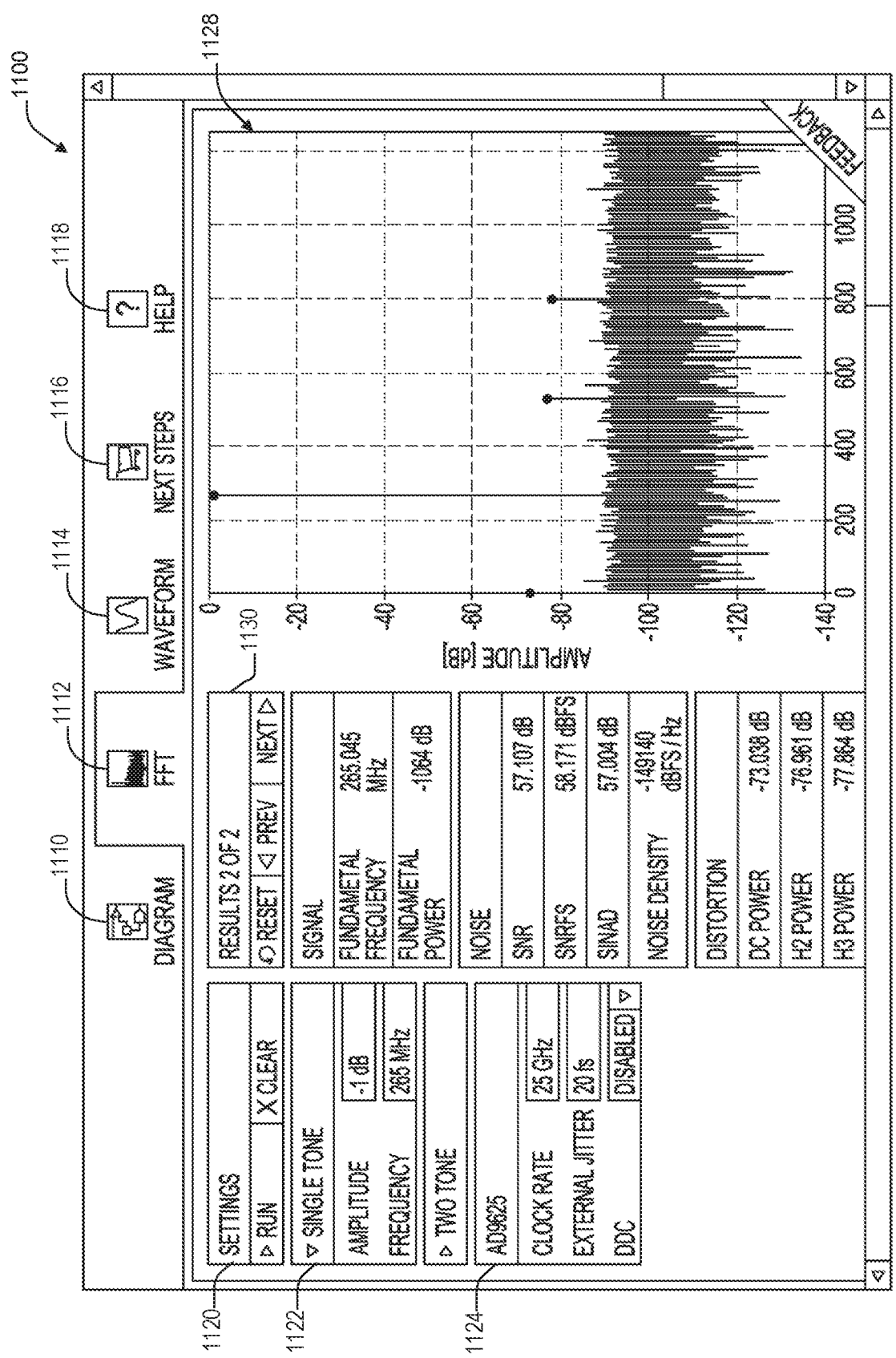
FIG. 13 is a screen shot showing another example of the evaluation screen of FIGS. 11 and 12 with an FFT analysis tab selected.

Evaluation data 462 may describe one or more evaluations that may utilize the configuration data set 340(1). For example, evaluation data 462 may describe one or more signal chains, one or more generators, and one or more analyses. Page data 464 may describe different pages of the UI 364, also referred to as screens of the UI 364. For example, page data 464 for a page may specify which arguments or bundles are displayed on a page and may specify what results are displayed. (Results may also be described in terms of arguments and/or bundles.) In some examples, phage data 464 for a page may specify what evaluations and/or analyses will be run and/or what graphs or other output forms will be displayed. For example, a page for a signal change that ends in an FFT analysis module may describe the presentation of an FFT graph, for example, as shown in FIG. 13.

Within an object, such as a simulator, generator, or analysis, there may be more parameters to be set in order for the object to function. Identification of which of the parameters are used in which object is known a priori based on the type. For example, the two-tone generator described above may require two amplitudes and two frequencies in order to generate signal output. These can be left as default values or may be assigned through a binding from arguments declared previously.

Figure 5:
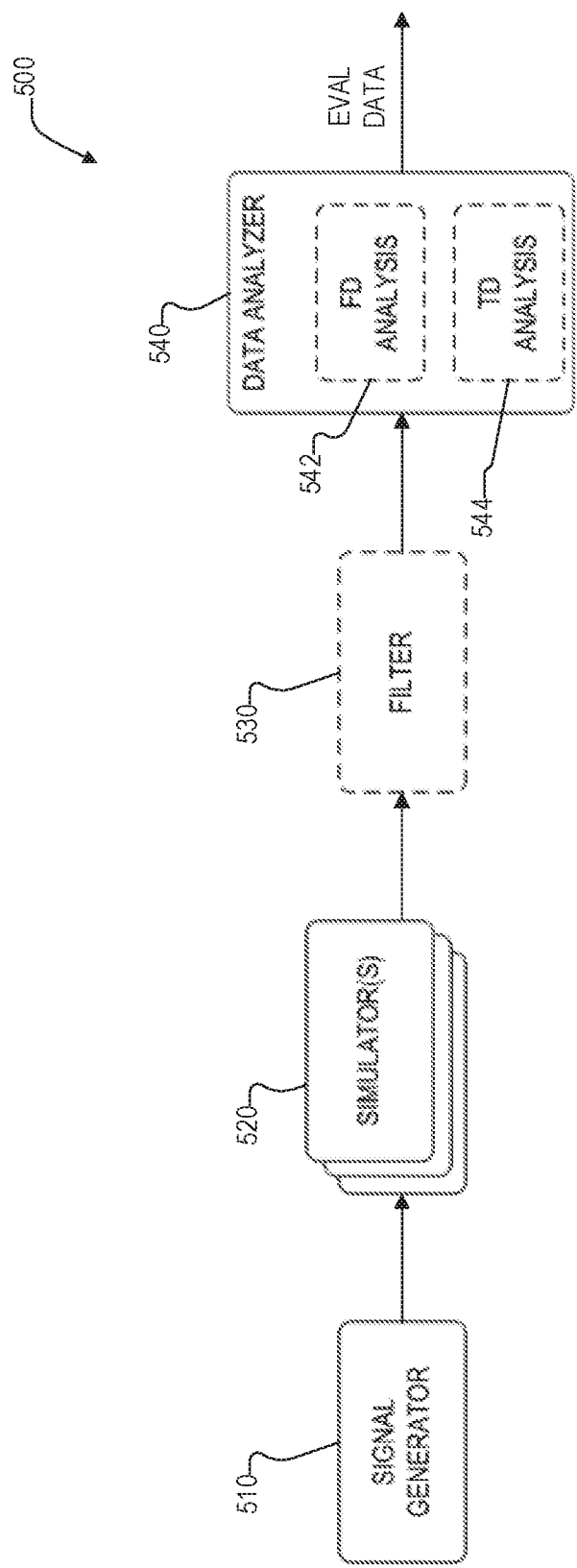
FIG. 5 illustrates a signal chain, according to an example embodiment of the disclosure.

Declared objects corresponding to the generators, simulators, and analyses may be relied upon in the performance simulation in the evaluation tool 324. For example, a signal chain may include one or more generators, one or more simulators, and one or more analyses. FIG. 5 illustrates a signal chain 500, according to an example embodiment of the disclosure. The signal chain 500 may include a signal generator 510, a simulator(s) 520, a filter 530, and a data analyzer 540. The signal chain 500 may be implemented by any of the various examples of the evaluation tool described herein. Many evaluations featured in the evaluation tool, particularly among high-speed products, may be computed using a signal chain superstructure, such as the signal chain 500. A signal chain may include three more substructures, called chain links, joined together in a specified manner. A first chain link is the signal generator 510 chain link, which may include an ability to generate and provide a stimulus signal. The generator 510 may be described by generator data at a configuration data set for a component or components that are the subject of the evaluation.

The signal generator 510 may link to one or more simulator(s) 520 chain links in sequence. As described above, the simulator or simulators may wrap a model 356 for modeling a component or set of components. Simulator(s) 520 may provide a generated stimulus signal (or an output of a previous simulator) to a model 356, such as a MOTIF model, for simulation. Outputs of the simulators 520 may be provided to other simulators and/or to a data analyzer 540 chain link, which may include one or more analyses to analyze the model output data to determine performance characteristics and provide evaluation data. In some examples, the simulated output data may be passed through the filter 530 prior to reaching the data analyzer 540. The filter 530 may include a SINC filter (e.g., sin(x)/(x) or sinc(πx)/(πx)), in some examples. In some examples, the filter may be simulated using a model 356 and simulator described by simulator data 458.

Figure 14:
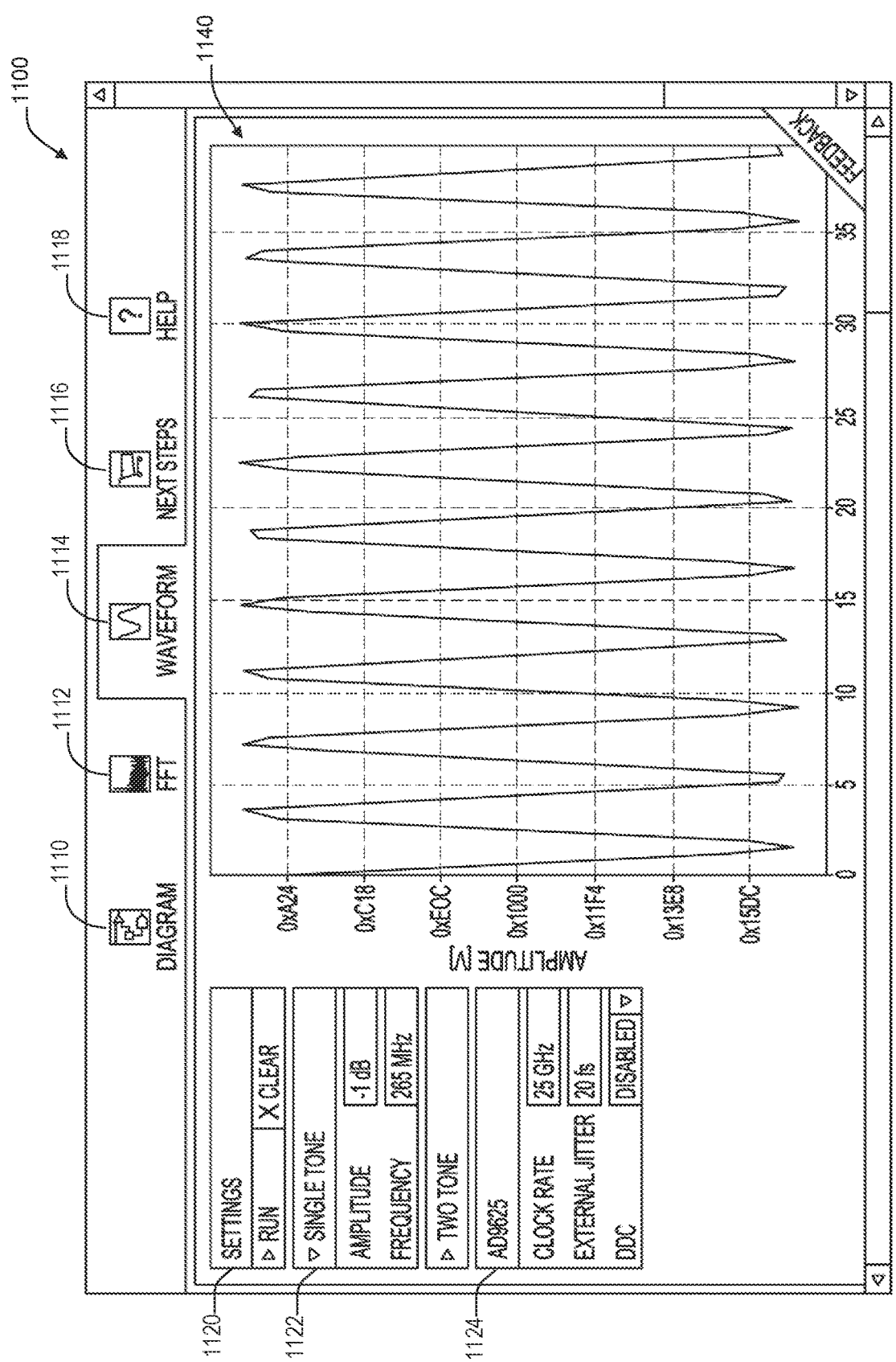
FIG. 14 is a screen shot showing another example of the evaluation screen of FIGS. 11 and 12 with a Waveform tab selected.

The data analyzer 540 includes two example analyses. For example, a frequency domain (FD) analysis 542 may execute and/or facilitate a FFT that transforms model output data into the frequency domain. In some examples, the FD analysis 542 may further determine noise and distortion characteristics, such as signal-to-noise ratio (SNR), based on the transformed simulated data. For example, the screen capture image 600 of FIG. 13 depicts the FFT graph when the FFT tab is selected. In some examples, the data analyzer 540 may include a time domain (TD) analysis 544 in addition to or instead of the FD analysis 542. The TD analysis may plot model output data on an X-Y plot showing a first model output parameter (e.g., current, voltage, power, etc.) versus time. For example, the evaluation screen 1100 shown in FIG. 14 depicts an X-Y plot at a graph screen 1128 when the Waveform tab 1114 is selected.

The example of FIG. 5 is just one possible signal chain arrangement. In some examples, signal chain structures can be more complex. For example, each link can also contain a static set of possible items, each of which is to be instantiated in the configuration data set. In that case, each link will determine at run-time which item to apply to the chain as a whole. This decision is typically based on configurations received from a client. For example, the signal generator 510 may apply a single-tone generator or a two-tone generator. Selection of which to apply may be determined at run-time depending upon a user configuration selection. Further, the simulator(s) 520 may apply either of two different models 356 (e.g., MOTIF models for the selected component), depending on whether the user has enabled a feature (e.g., a DDC) of the component or not.

Figure 6:
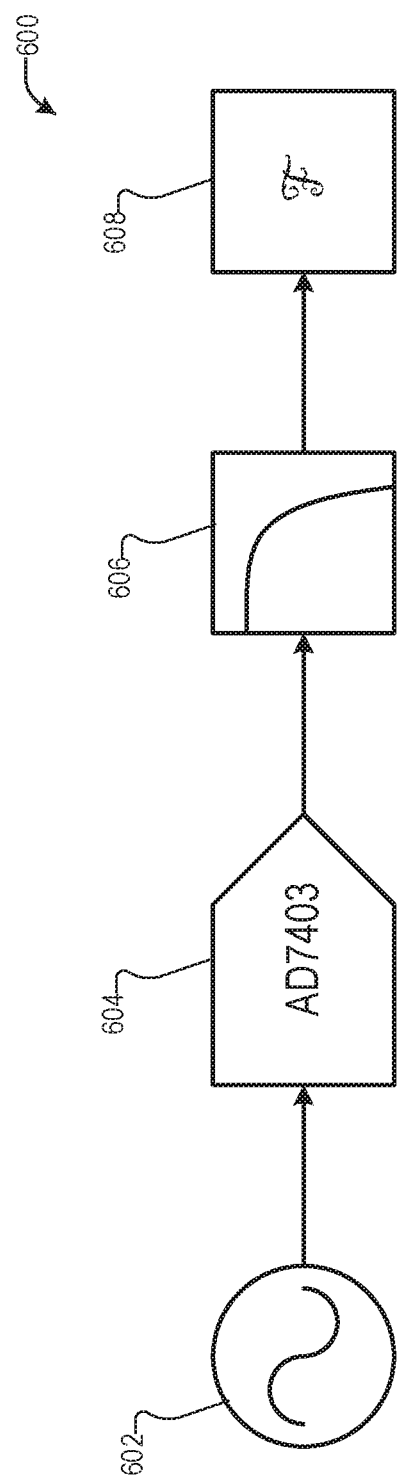
FIG. 6 is a diagram showing another example signal chain of FIG. 5.

FIG. 6 is a diagram showing another example signal chain 600. The signal chain 600 includes a generator 602 that is configured to generate a single tone, sinusoidal waveform. The signal chain also includes components ADC 604 and filter 606. The ADC 604 may convert an analog signal to digital. The filter 606 may be a low-pass filter, for example, to remove high frequency noise. An analysis 608 is a Fourier transform (e.g., a FD analysis) to show frequency content. Any suitable Fourier transform may be used including, for example, a FFT algorithm. The signal chain 600 may be described by a configuration data set 340. For example, generator data 456 may describe the generator 602 including, for example, properties and/or input parameters of the generator 602, which may be described in terms of arguments and/or bindings. Simulator data 458 may describe a model 356 for the ADC 604 and a model 356 for the filter 606 along with input parameters to the models, for example, in terms of arguments and/or bindings. Analysis data 460 may describe the Fourier transform analysis 608, for example, along with input parameters such as the type of Fourier transform to be used, a frequency range or frequency focus of the analysis, etc.

Figure 7:
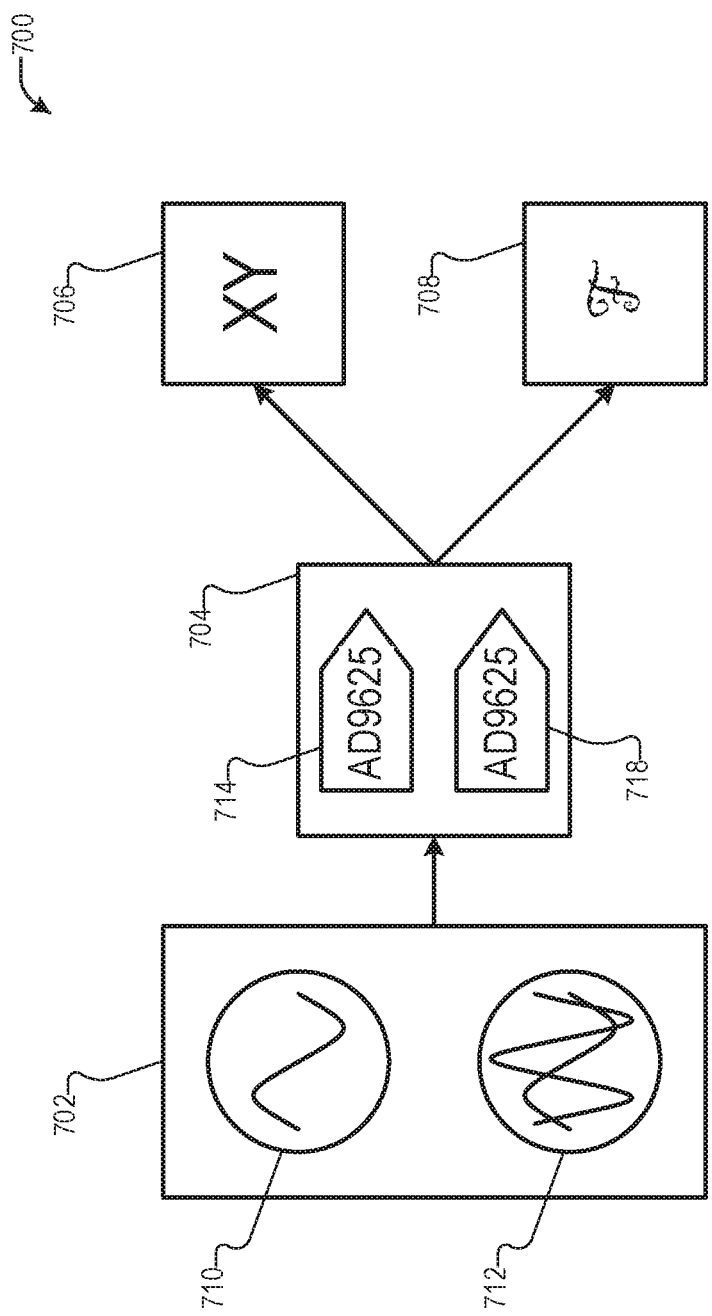
FIG. 7 is a diagram showing yet another example signal chain.

FIG. 7 is a diagram showing yet another example signal chain 700. For example, the signal chain 700 is a compound signal chain comprising various chain links having components that may be activated or deactivated to change the configuration of the signal chain 700. A generator chain link 702 may comprise two generators, a single tone generator 710 to generate a single tone sinusoidal stimulus signal and a dual tone generator 712 to generate a two-tone stimulus signal. The evaluation tool may determine which generator 710,712 to execute, for example, based on runtime or other settings provided by a user.

Similarly, a simulator chain link 704 may comprise two constituent simulators 714, 718, with each wrapping models of the same component (in this example, an ADC). For example, the simulator 714 may wrap a model of the ADC with a particular feature enabled (e.g., a DDC feature) while the simulator 718 may wrap a model of the ADC with the feature disabled. The evaluation tool 324 may determine which simulator 714, 718 and associated model 356 to use, for example, based on input parameters, which may be provided by the user at or before run time. The signal chain 700 also includes analyses 706, 708, which may include a TD, X-Y analysis 706 and a FD FFT analysis 708.

Figure 8:
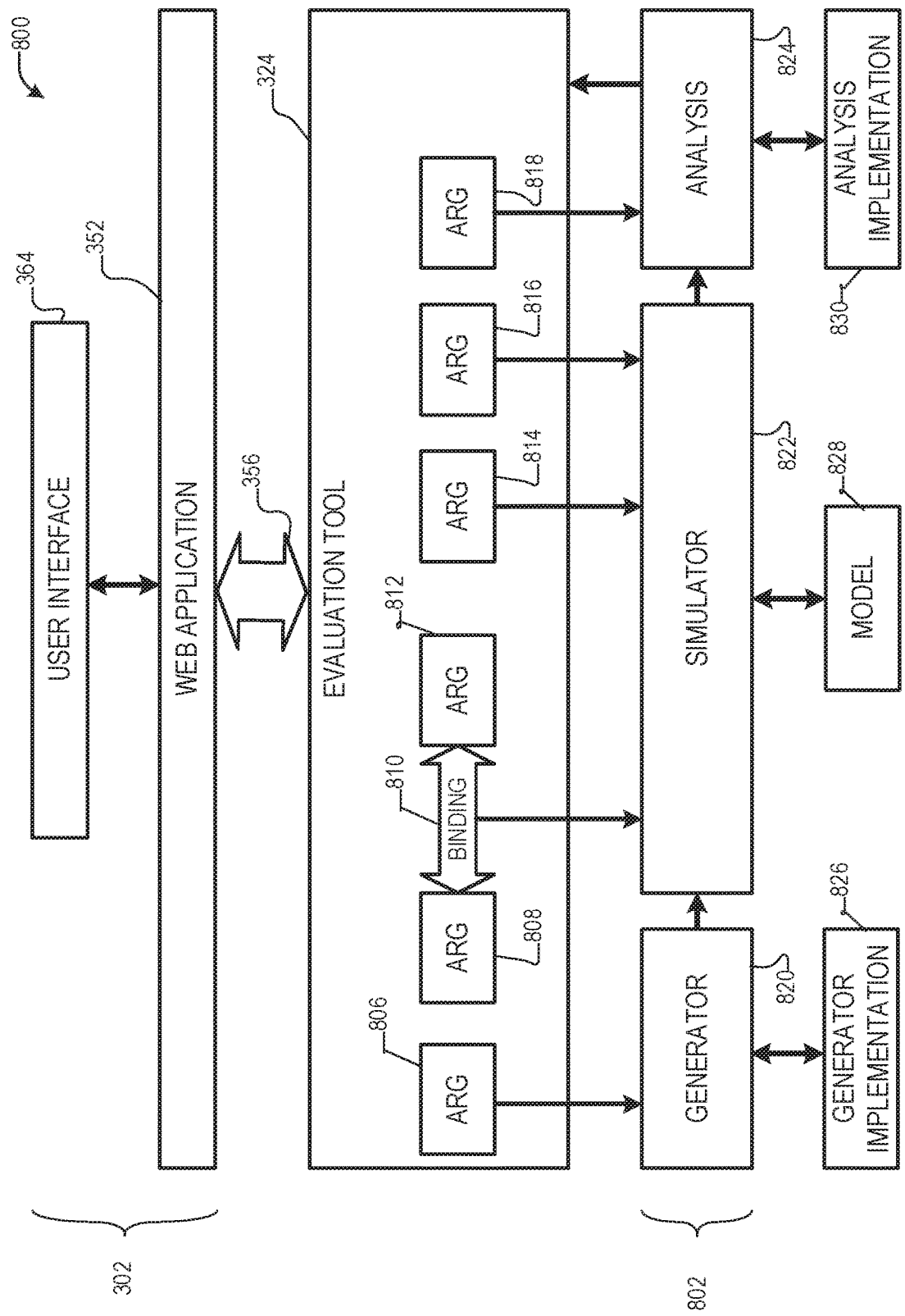
FIG. 8 is a diagram showing one example evaluation utilizing the client and the evaluation tool to evaluate an example signal chain.

FIG. 8 is a diagram showing one example evaluation 800 utilizing the client 302 and the evaluation tool 324 to evaluate an example signal chain 802. Although the evaluation 800 is described as being performed by the client 302, evaluation tool 324, and configuration data set 340(1), the evaluation 800, and similar evaluations, may be performed with various evaluation tools, clients, and configuration data sets, as described herein.

In the example of FIG. 8, the signal chain 802 includes a generator 820, a simulator 822, and an analysis 824, although other signal chains may be implemented by the evaluation tool in a similar way. Prior to implementing the evaluation 800, the evaluation tool 324 may retrieve a configuration data set that is associated with the signal chain 802 and/or one of the components of the signal chain 802. The configuration data set may include argument data describing arguments 806, 808, 812, 814, 816, 818, generator data describing the generator 820, simulator data describing the simulator 822, and analysis data describing the analysis 824.

The evaluation tool may receive values for some or all of the arguments 806, 808, 812, 814, 816, 818 from a user. For example, the user may provide values for some or all of the arguments 806, 808, 812, 814, 816, 818 to the web application 352 via the user interface 364. The web application 352 may provide values for the arguments 806, 808, 812, 814, 816, 818 to the evaluation tool 324 via the communication link 357 (FIG. 3). In some examples, some or all of the arguments 806, 808, 812, 814, 816, 818 have default values (e.g., defined in the configuration data set), rendering the receipt of evaluation-specific values from the user to be unnecessary in some cases.

Arguments may be provided to the generator 820, simulator 822, and/or analysis 824 as input parameters, either directly or as the result of bindings, such as binding 810. For example, argument 806 is provided to the generator 820 as a generator input parameter. The simulator 822 receives arguments 814 and 816 as simulator input parameters. The simulator 822 also receives another input parameter, in this example, which is a mathematical combination of the arguments 808 and 812. The analysis receives argument 818 as an analysis input parameter.

The generator 820 may provide the received generator input parameters to a generator implementation 826. The generator implementation 826 may be any suitable implementation of a generator that provides a stimulus signal for provision to the simulator 822. For example, the generator 826 may be executed at the same server that executes the evaluation tool 324 and/or at a different computing device. In some examples, the generator 826 may be or include a data generator comprising, for example, a table or other tables indicating a stimulus signal, such as a repeating stimulus signal. In some examples, the generator 826 may be or include an application that generates a data stream representing a stimulus signal. In some examples, the generator 826 may be or include a physical signal generator (e.g., for use with a bench model 362 as described herein).

The simulator 822 may receive model input parameters and the stimulus signal and provide the model input parameters and stimulus signal to the model 828, which may be any suitable type of model, such as described with respect to models 356 above. In some examples, the generator implementation 826 may provide the stimulus signal directly to the model 828, for example, bypassing the generator 820 and simulator 822. The model 828 may generate a model output signal or data stream that may be provided to the simulator 822 and/or directly to an analysis implementation 830. The analysis 824 may receive analysis input parameters and provide the analysis input parameters to the analysis implementation 830, which may generate evaluation output data. The evaluation output data may be provided to the analysis 824 and/or directly to the evaluation tool 324. The evaluation tool 324 may provide the evaluation output data to the web application 352, which may incorporate it into the user interface 364, for example, as described herein.

Figure 9:
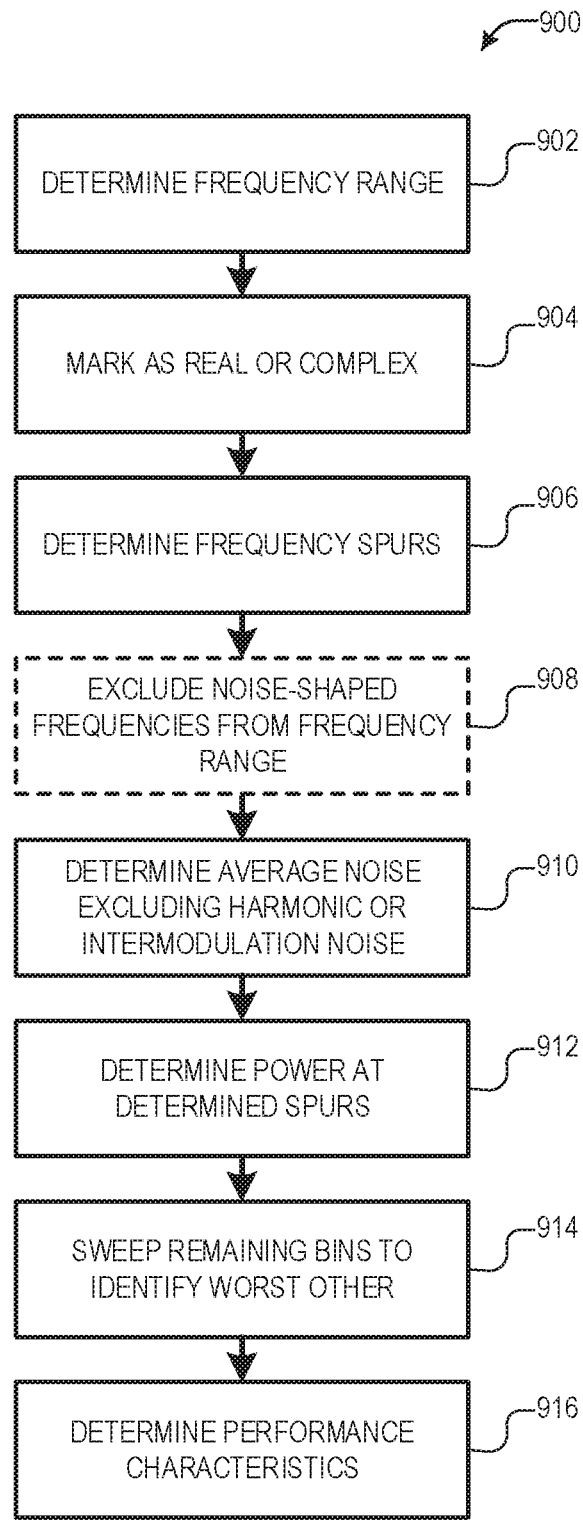
FIG. 9 is a flow chart showing one example embodiment of a process flow that may be executed to implement a Fast Fourier Transform (FFT) analysis.

FIG. 9 is a flow chart showing one example embodiment of a process flow 900 that may be executed to implement a FFT analysis. In some examples, the process flow 900 may be executed by the evaluation tool 324, for example, as part of the code implementing the evaluation tool 324. In other examples, the process flow 900 may be executed by a separate analysis implementation that may be called by the evaluation tool. The analysis implementation may execute at the same server that executes the evaluation tool 324 and/or at a different computing device. The process flow 900 is described as being executed by a computing device, which may be the server executing the evaluation tool 324 or any other suitable computing device. The process flow 900 may operate on an output data stream generated by a model 356.

At operation 902, the computing device may determine a frequency range of the output data stream. The frequency range may be determined, for example, by the value of an argument. In some examples, the frequency range is from direct current (DC), e.g., 0 Hz, to twice the Nyquist frequency, e.g., twice the sampling rate of the data stream. The sampling rate of the data stream may be set, for example, by a model of an ADC earlier in an evaluated signal chain.

In some examples, setting the frequency range from DC to twice the Nyquist frequency may generalize some aspects of the FFT analysis to apply the same to both real or complex signals. At operation 904, the computing device may determine whether the data stream is real or complex and mark accordingly. For example, the computing device may tag the data stream as real if it is real or as complex if it is complex. Because the data stream is either real or complex, the computing device will tag only real data streams or only complex data streams in some examples. When the computing device performs operations that involve different treatment of real and complex signals, it may refer to how the data stream is tagged and apply the appropriate real or complex operations. Example operations that differ depending on the real or complex nature of the data stream include Fourier transforms such as FFT. For example, spur power reported for complex data streams may differ from equivalent real data streams. Also, for various operations, the frequency band that is analyzed may be different for some complex versus real operations. For example, when real data streams are received, operations may consider DC to the Nyquist frequency. When complex data streams are received, operations may consider from DC to twice the Nyquist frequency.

At operation 906, the computing device may determine frequency spurs for the FFT analysis. For example, an FFT analysis may divide the frequency range of the data stream into a number of frequency bins, where each bin represents a discrete set of frequencies. A frequency spur may be or include a frequency bin where the data stream is expected to have frequency content. For example, for a single-tone analysis (e.g., based on a single-tone stimulus signal), frequency spurs may be at or around the frequency of the input tone as well as positive and negative harmonics of the single tone. In some examples, frequency spurs for a single tone analysis (e.g., an evaluation of a signal chain including a single tone generator) may be determined according to Equation [1] below:

$$F_n = k * n * (F + M_0) + M_1 \quad [1]$$

In Equation [1], Fn indicates the frequency spurs. The variable n represents the harmonics of the stimulus signal that are to be considered. In some examples, n may include a range of integers from −7 to 7. In examples where n includes the range of integers from −7 to 7, the analysis may consider seven negative harmonics of the single tone and seven positive harmonics of the single tone, although any other suitable number or range of harmonics may be considered. The variable k in Equation [1] is a constant multiplier. In some examples, the variable k is equal to one. In some examples of components having a spectral inversion characteristic, the variable k is equal to negative 1. The variable F in Equation [1] is the frequency of the single tone (e.g., the frequency of the single tone stimulus signal used).

In Equation [1], the variables $M_0$ and $M_1$ represent pre- and post-domain conversion mixing. For example, in signal chains including converters such as ADCs or DACs, either the converter or another component of the signal chain may perform mixing to achieve either up-conversion or down-conversion of the output. The variable $M_0$ may model frequency mixing before domain conversion, and the variable $M_1$ may model frequency mixing after domain conversion.

An example equation for determining frequency spurs in a two-tone analysis is given by Equation [2] below. A two-tone analysis may be an analysis where the stimulus signal comprises periodic signals at two discrete frequencies.

$$\text{IMD}_n = k^*n_1^*(F_1+M_0) + k^*n_2^*(F_2+M_0) + M_1 \quad [2]$$

In Equation [2], $\text{IMD}_n$ is the intermodulation distortion terms generated by the frequencies $F_1$ and $F_2$. The variables $n_1$ and $n_2$ represent harmonics of the respective tones of a stimulus signal. For example, $n_1$ and $n_2$ may be integers from −3 to 3. In some examples, $n_1$ and $n_2$ may also include frequencies of expected intermodulation distortions between the two tones of the stimulus signal. The variable k may be the constant multiplier. $F_1$ and $F_2$ may be the frequencies of the respective tones of the stimulus signal. The variables $M_0$ and $M_1$ may represent the same values described above with respect to Equation [1]. Values for the various variables of Equations [1] and [2], in some examples, are determined during execution, for example, based on arguments and/or bindings.

In one example, a converter, such as the AD9625 ADC available from Analog Devices, Inc., provides a DDC option that may be enabled or disabled. When the DDC option is enabled, the resulting signal is mixed down after conversion by a frequency sometimes called a numerically controlled oscillator (NCO) frequency. For example, a binding may relate an argument indicating the NCO frequency. In some examples, the NCO frequency may be applied as an offset to each of the generated spurs. In some examples, the offset is referred to as Postmix.

At optional operation 908, the computing device may exclude from further consideration frequencies from the frequency range that are distorted by noise shaping. For example, some components may utilize noise shaping to deliberately modify the frequency content of noise such that it falls outside of the frequency range where a signal is expected to reside. This may reduce the signal-to-noise ratio of the output. At the same time, it may distort the frequency content of the data stream by increasing the power of out-of-band content. Analysis input parameters for determining frequencies to be excluded due to noise-shaping may be received and/or calculated based on values for various arguments and/or bindings. For example, a component, such as a converter, that utilizes noise shaping may have a parameter called a tuning word, which may be represented as an argument. In some examples, the user may determine the value of the tuning word, which may be tied to the FFT analysis, for example, by a binding. The value of the tuning word may determine which frequencies are excluded, for example, according to a relationship that in some examples, is expressed as a formula. The relationship may be different for different components.

At operation 910, the computing device may determine an average noise of the data stream, for example, excluding harmonics of the stimulus signal and intermodulation frequencies (e.g., if the stimulus signal is multi-tone). At operation 912, the computing device may determine the power of the data stream at each of the spurs determined at 906. For example, the computing device may combine powers of a threshold number of frequency bins around a spur and compare the combined spur power to the noise floor, determined at operation 910. At operation 914, the computing device may sweep remaining bins of the frequency range to determine a worst other. The worst other may be a highest power frequency bin or set of frequency bins selected from those frequency bins or set of frequency bins that are not associated with harmonics and intermodulation frequencies. At operation 916, the computing device may determine output performance characteristics of the data stream such as, for example, SNR, spurious-free dynamic range (SFDR), etc.

In some examples, the computing device may add additional spurs to consider and/or detect out-of-band spectral content. For example, some components, such as some DACs used in Radio Frequency (RF) and other transmission applications, can introduce significant spectral content outside of the first Nyquist zone, and therefore outside of the frequency range determined at operation 902. When present, this out-of-band spectral content can sometimes leak into other frequency bands where the user does not have legal rights to transmit. In some examples, the FFT analysis may detect out-of-band spectral content by selecting and tracking additional spurs that may be frequency-shifted versions of some or all of the spurs determined at operation 906, shifted into a second Nyquist zone. To select out-of-band spurs, the computing device, in some examples, may duplicate one or more of the spurs determined at operation 906 and shift the duplicated spurs into a second or subsequent Nyquist zone. The computing device may compute power at the one or more out-of-band spurs. If the computed power for an out-of-band spur is above a threshold level, this may be reported to the user, for example, by writing a description of the out-of-band spur to evaluation output data provided to the user via the UI 364. For example, an out-of-band spur may be included in an output of the FFT analysis of FIG. 9. A user may utilize this feature to determine a need for and design of analog low-pass filters to be applied after the DAC.

In some examples, the evaluation tool 324 or other suitable component may be configured to detect poor frequency planning in a signal chain. For example, when an ADC receives a stimulus signal with a very low frequency relative to the ADC's clock rate, the stimulus signal and its harmonics may be indistinguishable from one another, rendering the output of the ADC very noisy. In some examples, a designer may inadvertently cause a poor frequency match with an ADC. For example, DDC, decimation, and other similar ADC and pre-ADC processing operations may reduce the frequency of the ADC stimulus signal in a way that may not be recognized by some designers. To address this, the evaluation tool 324, or other suitable component, may be configured to compare spurs generated at operation 906. For example, the evaluation tool 324, or other suitable component, may apply an offset to a first spur to generate an offset spur. For example, the offset spur may represent a harmonic or intermodulation distortion of the stimulus signal. The evaluation tool 324, or other suitable component, may then determine if the power at the offset spur is greater than the power at the original spur. If yes, it may indicate that the frequency of the ADC input is too low. The evaluation tool 324, or other suitable component, may generate an alert that may be provided to the user, for example, via evaluation output data displayed at the UI 364. The user may elect to redesign the circuit and/or proceed with the evaluation.

In some examples, the evaluation tool 324 or other suitable component may be configured to detect the use of an unsuitable tuning word, for example, when evaluating an ADC that utilizes noise shaping. For example, the noise-shaping used by any particular ADC may be configurable by providing a tuning word. The tuning word may describe the frequency bands where the stimulus signal is likely to reside (e.g., an ideal band). In some examples, a user may select the wrong tuning word, in which case the ADC may shift noise into the bandwidths occupied by the stimulus signal, resulting in a low signal-to-noise ratio. In some examples, the evaluation tool 324, or other suitable component, may compare the stimulus signal to the ideal band indicated by the tuning word. If the stimulus signal falls outside of the ideal band, the evaluation tool 324, or other suitable component, may alert the user, for example, by writing improper noise shaping data to the evaluation output data provided at the UI 364. The user may elect to redesign the circuit and/or proceed with the evaluation.

In some examples, the evaluation tool may be configured to detect and alert a user if the user attempts to evaluate a component or signal chain that experiences excessive clipping. Clipping may occur, for example, at an ADC where the analog signal received by the ADC is higher than the ADC is able to represent in its output digital data stream. The highest value that an ADC can represent in an output digital data stream, referred to herein as the full-scale value, may be the highest digital value that the ADC generates. For example, in a 16 bit ADC, the full-scale value may occur when the output of the ADC is 65536 in decimal. The corresponding physical value (e.g., voltage, current, etc.) corresponding to the full-scale value may vary, for example, based on the resolution of the ADC.

Figure 10:
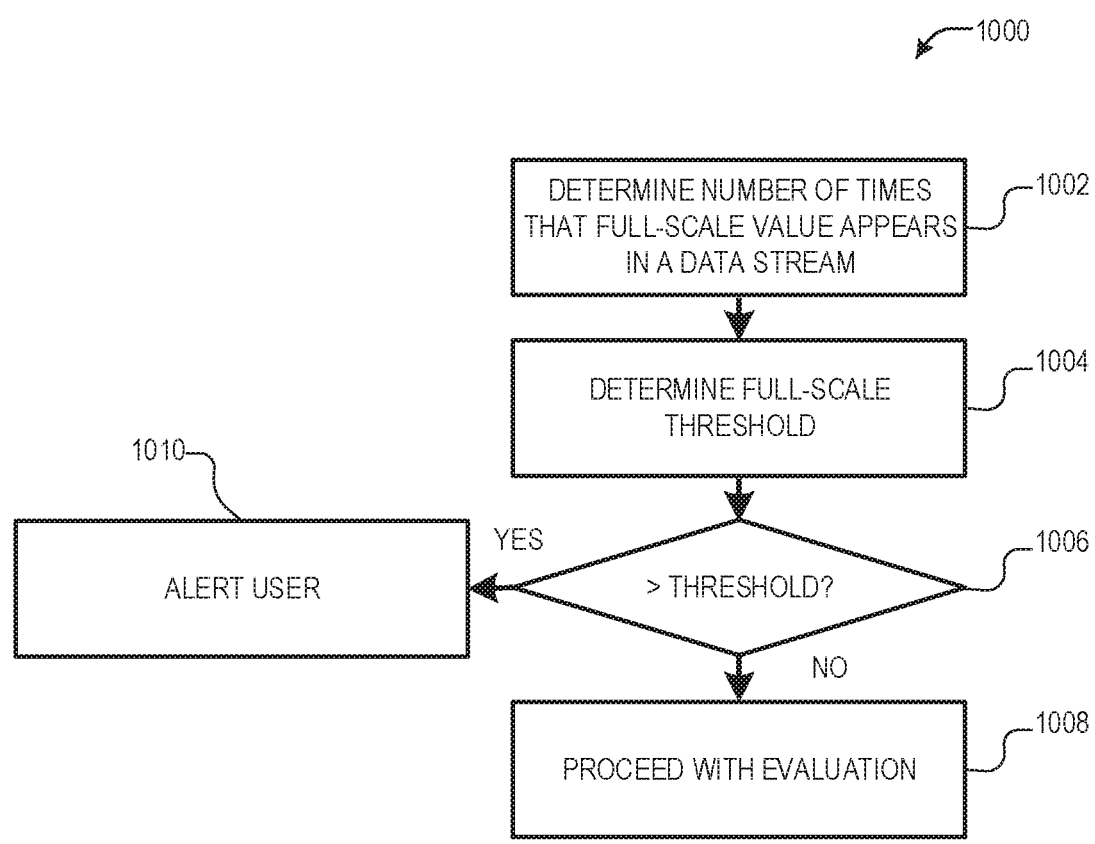
FIG. 10 is a flowchart showing one example of a process flow that may be executed to detect clipping by an analog-to-digital converter (ADC).

In some examples, the evaluation tool 324 may be configured to detect clipping by an ADC during an evaluation of a component or signal chain. FIG. 10 is a flowchart showing one example of a process flow 1000 that may be executed to detect clipping by an ADC. In some examples, the process flow 1000 may be executed by the evaluation tool 324, for example, as part of the code implementing the evaluation tool 324. In other examples, the process flow 1000 may be executed by a separate analysis implementation that may be called by the evaluation tool. The analysis implementation may execute at the same server that executes the evaluation tool 324 and/or at a different computing device. The process flow 1000 is described as being executed by a computing device, which may be the server executing the evaluation tool 324 or any other suitable computing device.

At operation 1002, the computing device may determine a number of times that a full-scale value appears in the data stream. At operation 1004, the computing device may determine a full-scale threshold for the data stream. The full-scale threshold may be a maximum acceptable rate of full-scale values in the data stream. In some examples, the full-scale threshold may describe the number of full-scale values that would occur if the ADC received an analog input of a sinusoid with an amplitude that matches the scale of the ADC. For example, the computing device may determine a peak value, which may represent the proportion of all output samples that would be discretized to the full-scale value when the analog input to the ADC is the full-scale amplitude sinusoid. In some examples, the peak value may be given by Equation [4] below:

$$\text{Peak} = \sin^{-1}\left(\left(\frac{N_{codes}-1}{N_{codes}}\right)*\frac{2}{\pi}\right) \quad [4]$$

In Equation [3], $N_{codes}$ may be the number of unique output codes that may be generated by the ADC. For example, for a 16-bit converter may generate 65536 unique output codes. The full-scale threshold may be given by Equation [5] below:

$$\text{Threshold}=(1-\text{Peak})\times\text{Length} \quad [5]$$

In Equation [5], Length may be the length of the data stream, which may be represented as a number of samples taken by the ADC. Equations [4]-[5] show just one example way to determine a full-scale threshold.

At operation 1006, the computing device may compare the data stream to the full-value threshold determined at operation 1004. If the number of full-scale values in the data stream is not greater than the full-scale threshold, then the computing device may proceed with an evaluation at operation 1008. For example, the computing device may perform an FFT as described at FIG. 9 or other analysis of the evaluated signal chain. If the number of full-scale values in the data stream is greater than the full-scale threshold, it may indicate that the ADC has likely received a signal that exceeds the full-scale amplitude that it can accurately discretize. The computing device may alert the user at 1010. For example, the evaluation tool 324 may provide an alert message to the client 302, which may provide the alert through evaluation output data provided at the UI 364. In some examples, the evaluation may cease. In other examples, the user may be prompted on whether to proceed with the evaluation, despite clipping.

Figure 11:
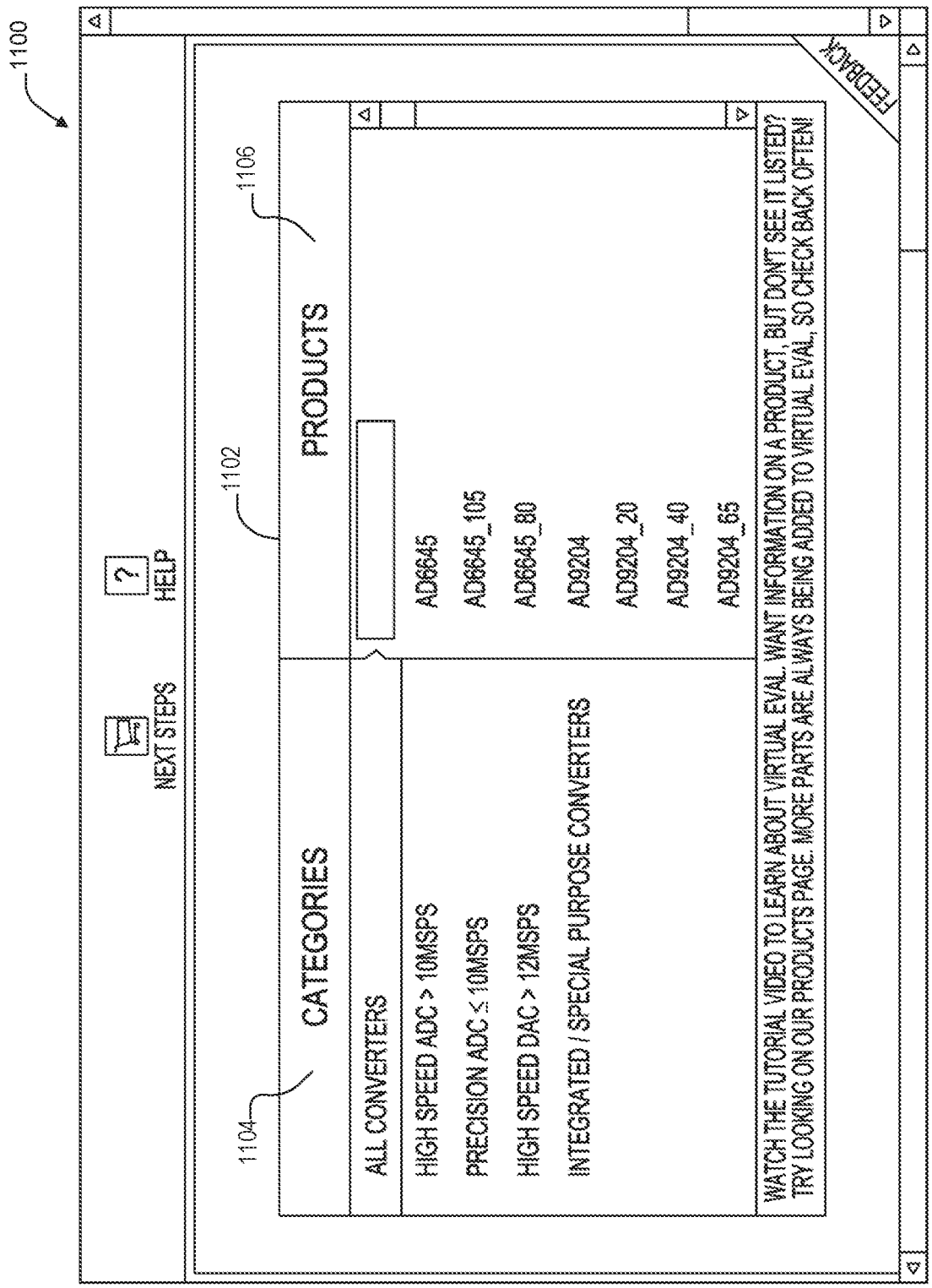
FIG. 11 is a screen shot showing one example of an evaluation screen that may be provided to a user via a user interface (UI).

FIGS. 11-15 show screen shots that may be provided to a user, for example, via the UI 364, by the evaluation tool 324, and/or client 302 as described herein. For example, FIG. 11 is a screen shot showing one example of an evaluation screen 1100. In the example of FIG. 11, the evaluation screen 1100 includes a component selection window 1102. In FIG. 11, the component selection window 1102 includes a component category field 1104 from which a user may select a category of components. Any suitable category of component may be selected. When the user selects a component category, a product field 1106 may include specific examples of the components in the selected category. In some examples, components selected via the component selection window 1102 may be all or part of signal chain data describing a signal chain to be evaluated.

Figure 12:
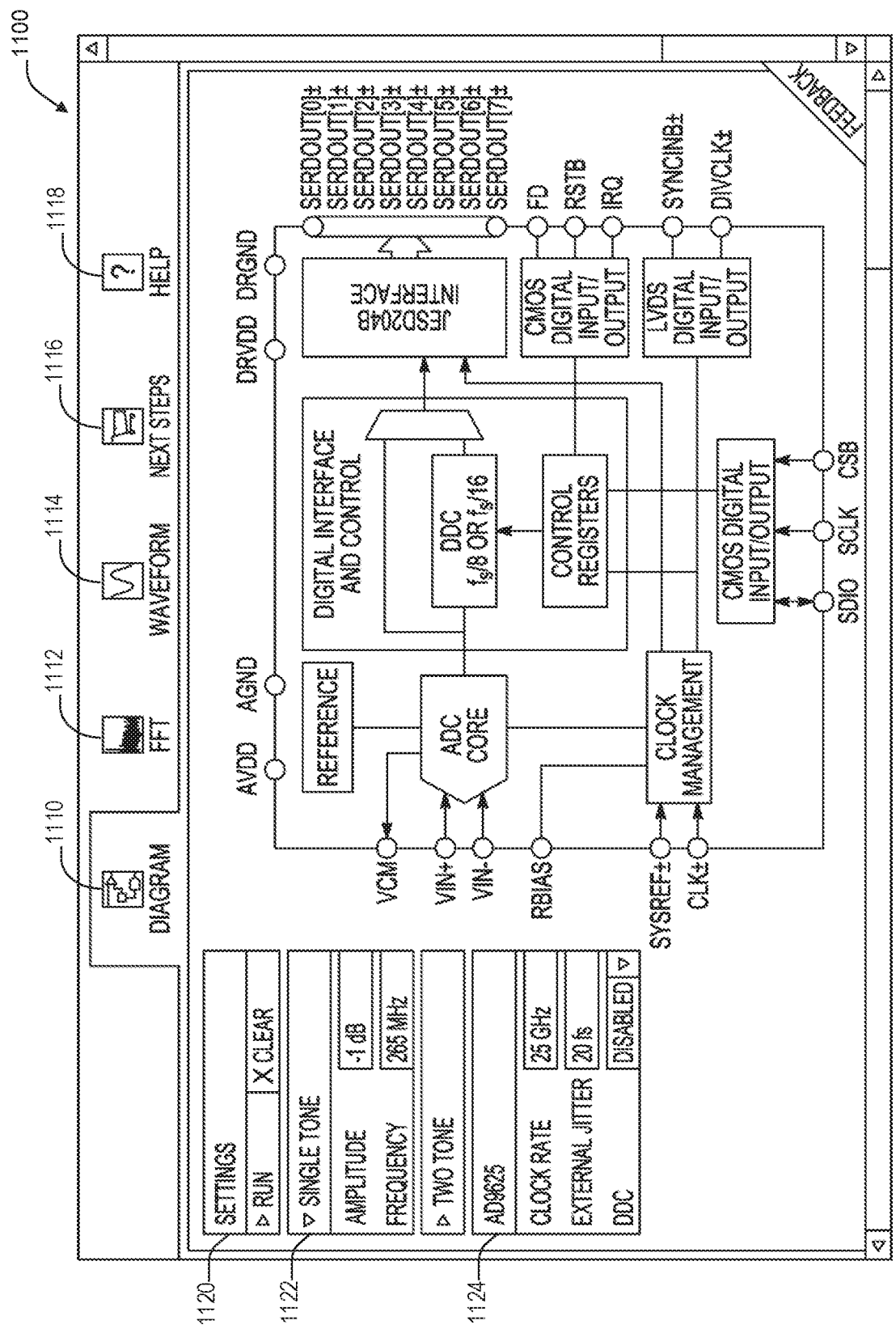
FIG. 12 is a screen shot showing another example of the evaluation screen with additional features.

FIG. 12 is a screen shot showing another example of the evaluation screen 1100 with additional features. As shown in FIG. 12, the evaluation screen 1100 may include various tabs 1110, 1112, 1114, 1116, 1118 that may be selected to access functionalities of the evaluation tool 324. In the example of the evaluation screen 1100 shown in FIG. 12, a diagram tab 1110 is selected. For example, the evaluation screen 1100 may include a diagram field 1126 showing a diagram of a component to be modeled. For example, in FIG. 12, the diagram field 1126 shows a diagram of an ADC. In some examples, the diagram field 1126 may show a signal chain to be modeled.

In the example of FIG. 12, the evaluation screen 110 also includes a Settings field 1120 and argument fields 1122, 1124. The Settings field 1120 may include control inputs for the evaluation. For example, the Settings field 1120 includes a Run button that, when selected, may prompt the client 302 to initiate an evaluation by the evaluation tool 324. Argument fields 1122, 1124 may include fields for receiving values for various arguments. Arguments prompted at the fields 1122, 1124 may be described by argument data at the configuration data set for the selected component or signal chain. In some examples, the specific arguments prompted at the fields 1122, 1124 may be described by bundle data at the configuration data set.

FIG. 13 is a screen shot showing another example of the evaluation screen 1100 with an FFT analysis tab 1112 selected. A graphical result field 1128 shows evaluation output data including a graphical representation of an FFT analysis of the component. The FFT analysis may be performed, for example, as described herein with respect to FIGS. 9-10. A numerical result field 1130 shows various numerical results of the FFT analysis including, for example, results relating to the signal, noise, and distortion. FIG. 14 is a screen shot showing another example of the evaluation screen 1100 with a Waveform tab 1114 selected. This may cause the evaluation screen 1100 to display an evaluation output data including an X-Y analysis, as described herein. For example, the screen shot 1100, in the example of FIG. 14, includes a graph screen 1140 showing a graph of an example output signal.

Figure 15:
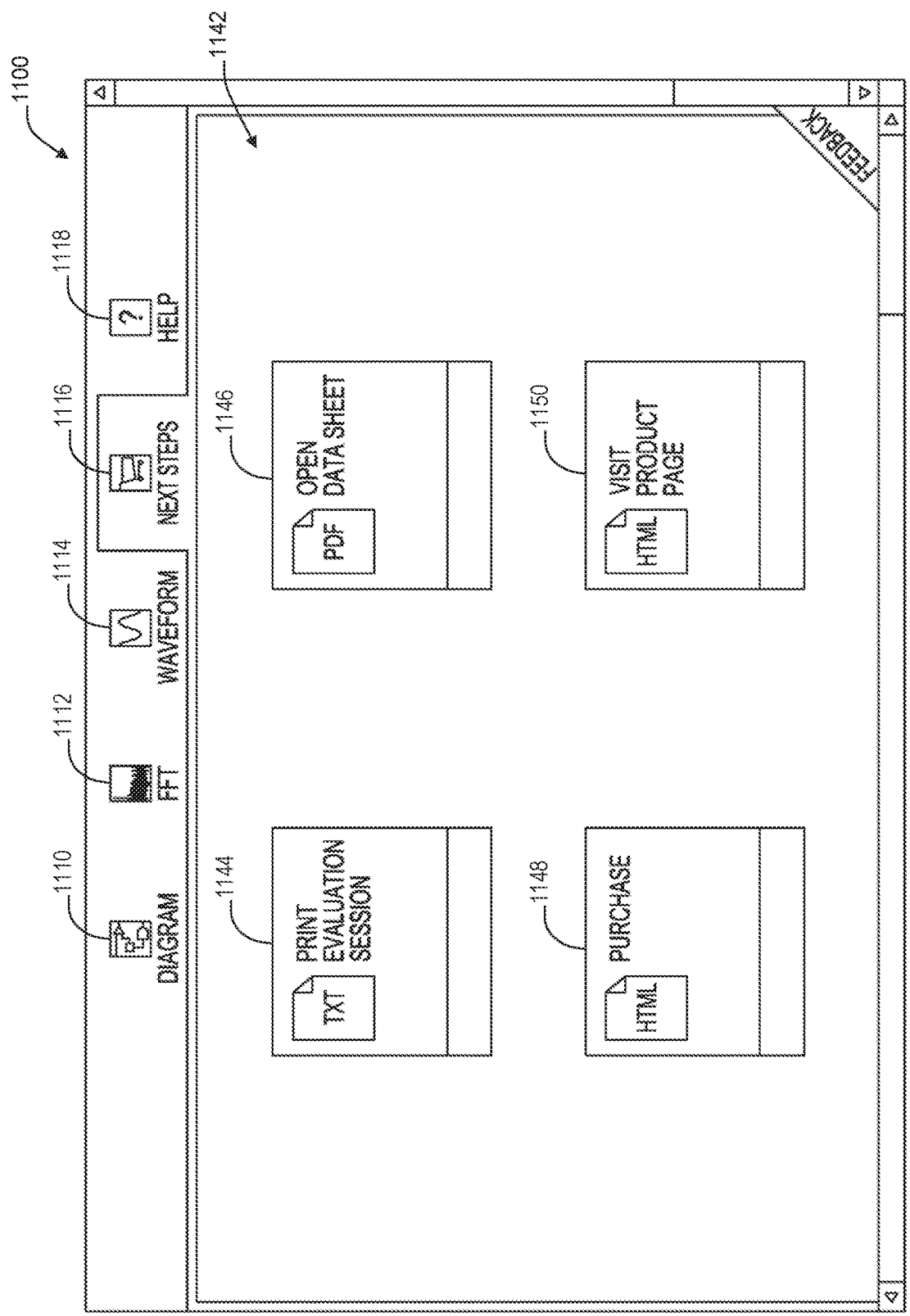
FIG. 15 is a screen shot showing another example of the evaluation screen of FIGS. 11 and 12 with a Next Steps tab selected.

FIG. 15 is a screen shot showing another example of the evaluation screen 1100 with a Next Steps tab 1116 selected. A next steps field 1142 may provide links to other activities that the user can engage in, for example, related to the evaluated component or components. For example, a Print Evaluation Session button 1144, when selected, may cause the client 302 to print and/or save at least a portion of the information provided by tabs 1110, 1112, 1114, etc. An Open Data Sheet button 1146, when selected by the user, may cause the client 302 to access a data sheet for one or more of the components evaluated. A Purchase button 1148, when selected by the user, may cause the client 302 to link to a web page, e.g., through web browser application 350, or other location where the user can purchase one or more of the evaluated components, for example, either separately or with an evaluation board. A Visit Product Page button 1150, when selected by the user, may cause the web browser application 350 to load a web page providing information about a component or components that were the subject of the evaluation. A Help tab 1118, when selected, may provide the user with various offline and/or live help options for using the evaluation tool 324.

Figure 16:
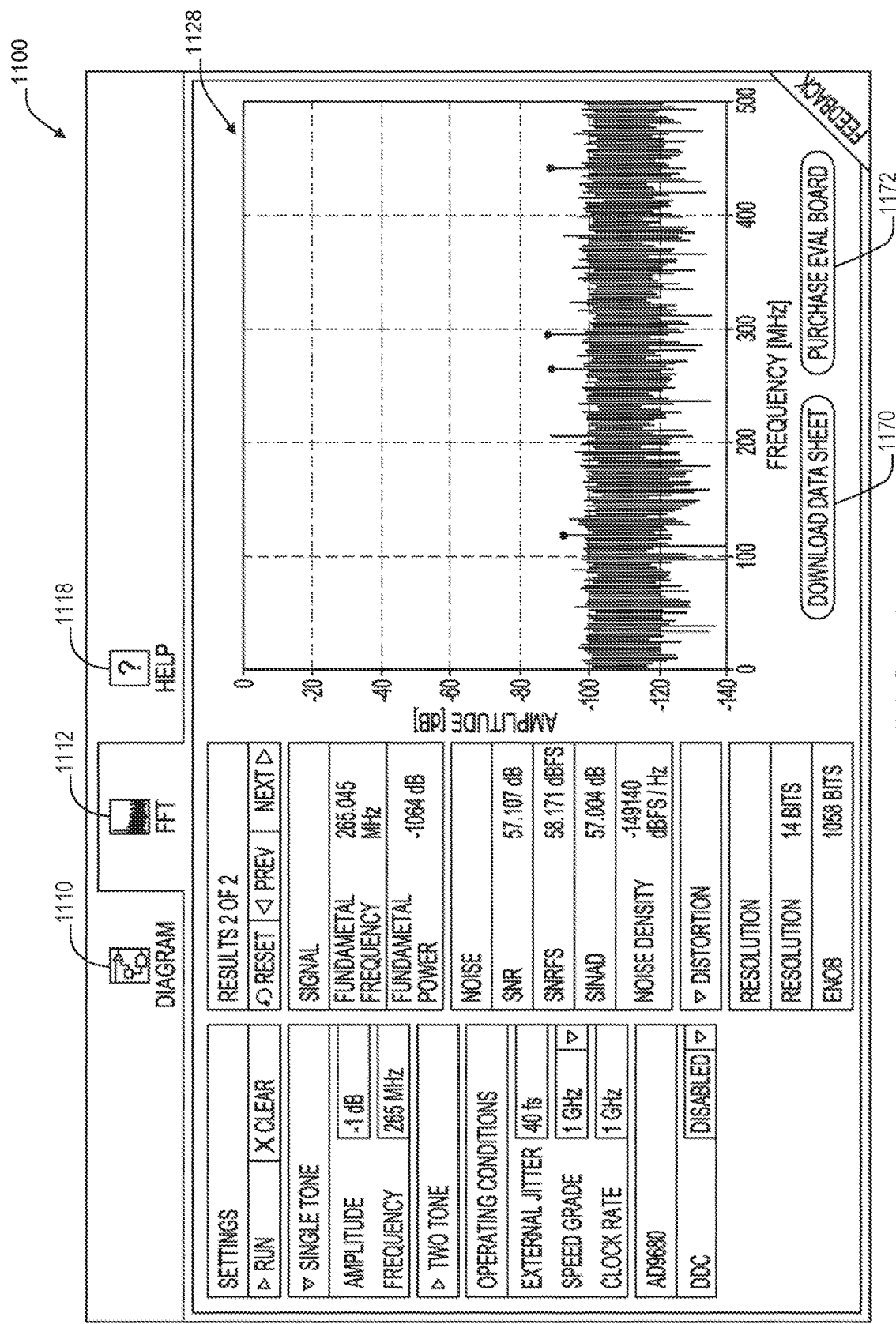
FIG. 16 is a screen shot showing an example of another configuration of the evaluation screen of FIGS. 11 and 12.

FIG. 16 is a screen shot showing an example of another configuration of the evaluation screen of FIGS. 11 and 12. In the example of FIG. 16, a Download Data Sheet button 1170 and a Purchase Eval Board button 1172 are added. The Download Data Sheet button 1170, when selected by the user, may cause the web browser application 350 to load a web page including a data sheet for one or more of the evaluated components. The Purchase Eval Board button 1172, when selected by the user, may cause the client 302 to link to a web page or other location where the user can purchase one or more of the evaluated components, either separately or with an evaluation board. In the example of FIG. 16, the Next Steps tab 1116 shown in other examples of the screen 1100 is omitted. In various examples, the buttons 1170 and 1172 may be include in place of the Next Steps tab 1116 and/or in addition to the Next Steps tab 1116. Also, although the FFT tab 1112 is selected in FIG. 16, in various examples, the buttons 1170, 1172 may appear on the screen 1100 when various other tabs, 1110, 1114, 1118, etc., are selected.

Figure 17:
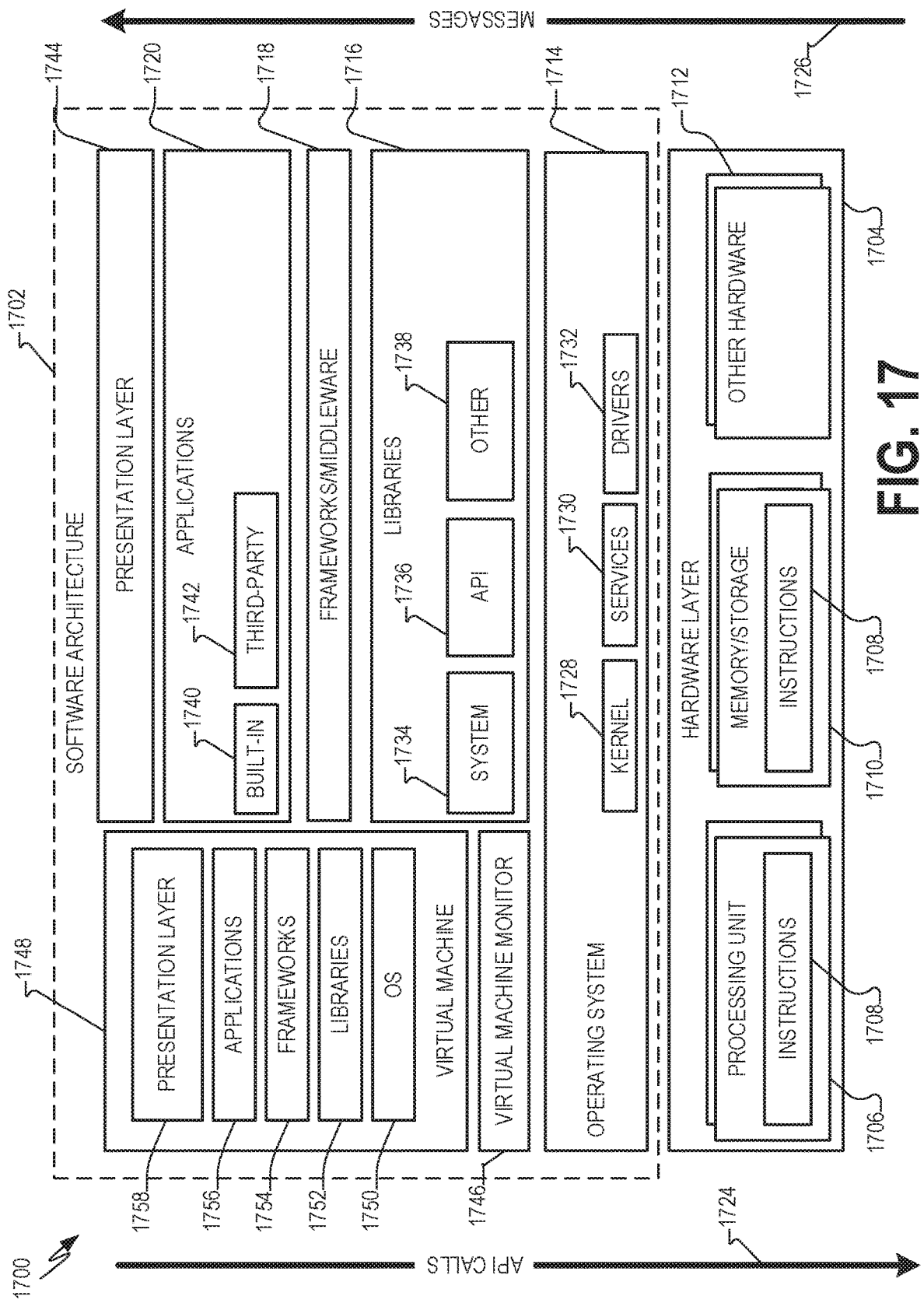
FIG. 17 is a block diagram showing one example of a software architecture for a computing device.

FIG. 17 is a block diagram 1700 showing one example of a software architecture 1702 for a computing device. The architecture 1702 maybe used in conjunction with various hardware architectures such as, for example, the server 120, the clients 102(1-N), 302, etc., for example, as described herein. FIG. 17 is merely a non-limiting example of a software architecture 1702 and many other architectures may be implemented to facilitate the functionality described herein. A representative hardware layer 1704 is illustrated and can represent, for example, any of the above referenced computing devices. In some examples, the hardware layer 1704 may be implemented according to the architecture 1702 of FIG. 17 and/or the architecture 1800 of FIG. 18.

The representative hardware layer 1704 comprises one or more processor units 1706 having associated executable instructions 1708. Executable instructions 1708 represent the executable instructions of the software architecture 1702, including implementation of the methods, modules, components, and so forth of FIGS. 1-21. Hardware layer 1704 also includes memory and/or storage modules 1710, which also have executable instructions 1708. Hardware layer 1704 may also comprise other hardware as indicated by other hardware 1712, which represents any other hardware of the hardware layer 1704, such as the other hardware illustrated as part of hardware architecture 1800.

In the example architecture of FIG. 17, the software architecture 1702 may be conceptualized as a stack of layers where each layer provides particular functionality. For example, the software architecture 1702 may include layers such as an operating system 1714, libraries 1716, frameworks/middleware 1718, applications 1720 and presentation layer 1744. Operationally, the applications 1720 and/or other components within the layers may invoke API calls 1724 through the software stack and receive a response, returned values, and so forth illustrated as messages 1726 in response to the API calls 1724. The layers illustrated are representative in nature and not all software architectures have all layers. For example, some mobile or special purpose operating systems may not provide a frameworks/middleware layer 1718, while others may provide such a layer. Other software architectures may include additional or different layers.

The operating system 1714 may manage hardware resources and provide common services. The operating system 1714 may include, for example, a kernel 1728, services 1730, and drivers 1732. The kernel 1728 may act as an abstraction layer between the hardware and the other software layers. For example, the kernel 1728 may be responsible for memory management, processor management (e.g., scheduling), component management, networking, security settings, and so on. The services 1730 may provide other common services for the other software layers. In some examples, the services 1730 include an interrupt service. The interrupt service may detect the receipt of a hardware or software interrupt and, in response, cause the architecture 1702 to pause its current processing and execute an interrupt service routine (ISR) when an interrupt is received. The ISR may generate the alert, for example, as described herein.

The drivers 1732 may be responsible for controlling or interfacing with the underlying hardware. For instance, the drivers 1732 may include display drivers, camera drivers, Bluetooth® drivers, flash memory drivers, serial communication drivers (e.g., Universal Serial Bus (USB) drivers), Wi-Fi® drivers, NFC drivers, audio drivers, power management drivers, and so forth depending on the hardware configuration.

The libraries 1716 may provide a common infrastructure that may be utilized by the applications 1720 and/or other components and/or layers. The libraries 1716 typically provide functionality that allows other software modules to perform tasks in an easier fashion than to interface directly with the underlying operating system 1714 functionality (e.g., kernel 1728, services 1730 and/or drivers 1732). The libraries 1716 may include system libraries 1734 (e.g., C standard library) that may provide functions such as memory allocation functions, string manipulation functions, mathematic functions, and the like. In addition, the libraries 1716 may include API libraries 1736 such as media libraries (e.g., libraries to support presentation and manipulation of various media format such as MPEG4, H.264, MP3, AAC, AMR, JPG, PNG), graphics libraries (e.g., an OpenGL framework that may be used to render 2D and 9D in a graphic content on a display), database libraries (e.g., SQLite that may provide various relational database functions), web libraries (e.g., WebKit that may provide web browsing functionality), and the like. The libraries 1716 may also include a wide variety of other libraries 1738 to provide many other APIs to the applications 1720 and other software components/modules.

The frameworks 1718 (also sometimes referred to as middleware) may provide a higher-level common infrastructure that may be utilized by the applications 1720 and/or other software components/modules. For example, the frameworks 1718 may provide various graphic user interface (GUI) functions, high-level resource management, high-level location services, and so forth. The frameworks 1718 may provide a broad spectrum of other APIs that may be utilized by the applications 1720 and/or other software components/modules, some of which may be specific to a particular operating system or platform.

The applications 1720 include built-in applications 1740 and/or third-party applications 1742. Examples of representative built-in applications 1740 may include, but are not limited to, a contacts application, a browser application, a book reader application, a location application, a media application, a messaging application, and/or a game application. Third-party applications 1742 may include any of the built-in applications 1740 as well as a broad assortment of other applications. In a specific example, the third-party application 1742 (e.g., an application developed using the Android™ or iOS™ software development kit (SDK) by an entity other than the vendor of the particular platform) may be mobile software running on a mobile operating system such as iOS™, Android™, Windows® Phone, or other user computing device operating systems. In this example, the third-party application 1742 may invoke the API calls 1724 provided by the mobile operating system such as operating system 1714 to facilitate functionality described herein.

The applications 1720 may utilize built-in operating system functions (e.g., kernel 1728, services 1730 and/or drivers 1732), libraries (e.g., system 1734, APIs 1736, and other libraries 1738), and frameworks/middleware 1718 to create user interfaces to interact with users of the system. Alternatively, or additionally, in some systems, interactions with a user may occur through a presentation layer, such as presentation layer 1744. In these systems, the application/module "logic" can be separated from the aspects of the application/module that interact with a user.

Some software architectures utilize virtual machines. For example, systems described herein may be executed utilizing one or more virtual machines executed at one or more server computing machines. In the example of FIG. 17, this is illustrated by virtual machine 1748. A virtual machine creates a software environment where applications/modules can execute as if they were executing on a hardware computing device. A virtual machine is hosted by a host operating system (operating system 1714) and typically, although not always, has a virtual machine monitor 1746, which manages the operation of the virtual machine 1748 as well as the interface with the host operating system (i.e., operating system 1714). A software architecture executes within the virtual machine 1748 such as an operating system 1750, libraries 1752, frameworks/middleware 1754, applications 1756 and/or presentation layer 1758. These layers of software architecture executing within the virtual machine 1748 can be the same as corresponding layers previously described or may be different.

Figure 18:
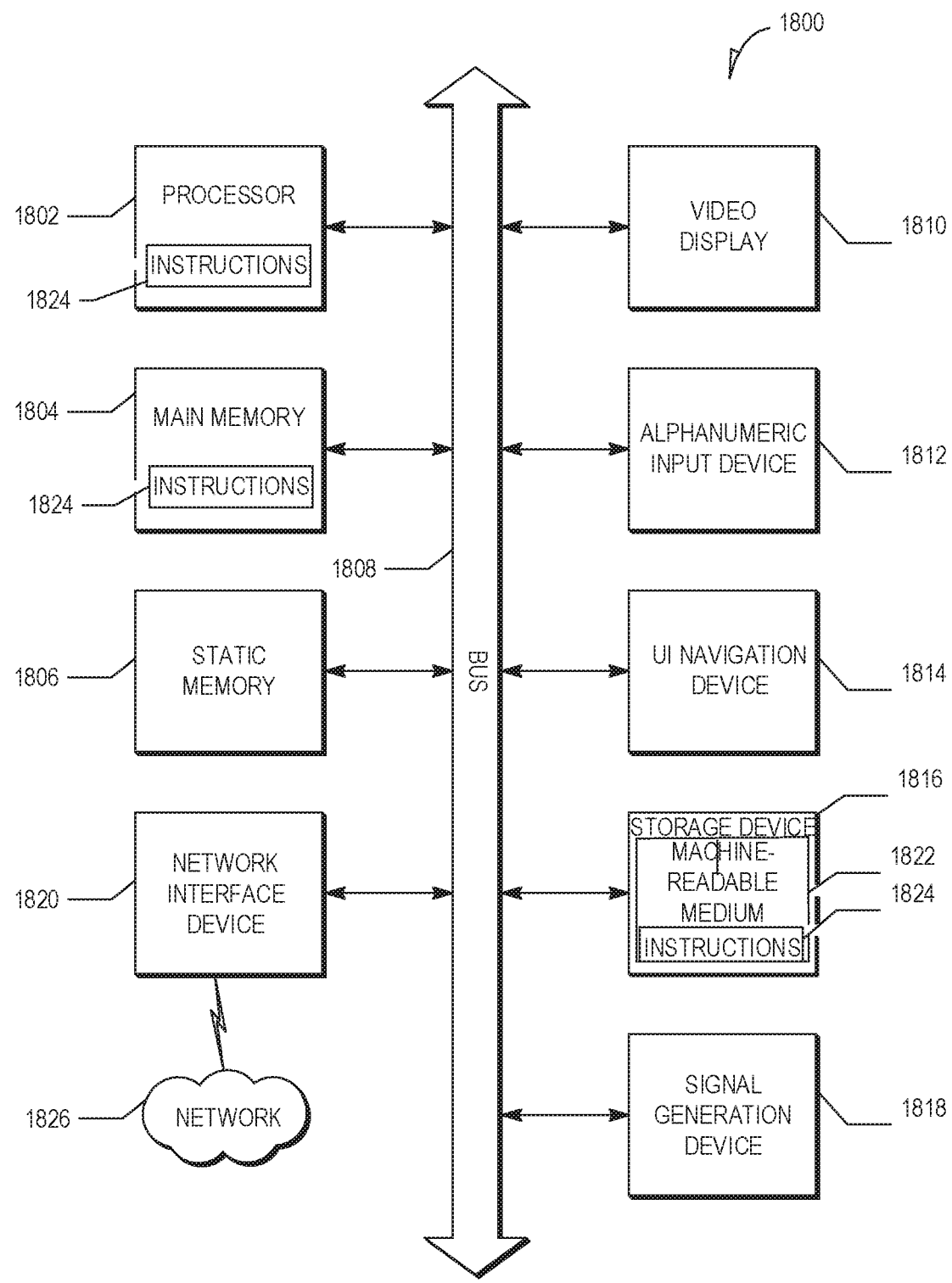
FIG. 18 is a block diagram illustrating a computing device hardware architecture, within which a set or sequence of instructions can be executed to cause the machine to perform examples of any one of the methodologies discussed herein.

FIG. 18 is a block diagram illustrating a computing device hardware architecture 1800, within which a set or sequence of instructions can be executed to cause the machine to perform examples of any one of the methodologies discussed herein. For example, the architecture 1800 may execute the software architecture 1702 described with respect to FIG. 17. The architecture 1800 may operate as a standalone device or may be connected (e.g., networked) to other machines. In a networked deployment, the architecture 1800 may operate in the capacity of either a server or a client machine in server-client network environments, or it may act as a peer machine in peer-to-peer (or distributed) network environments. The architecture 1800 can be implemented in a personal computer (PC), a tablet PC, a hybrid tablet, a set-top box (STB), a personal digital assistant (PDA), a mobile telephone, a web appliance, a network router, switch or bridge, or any machine capable of executing instructions (sequential or otherwise) that specify operations to be taken by that machine.

Example architecture 1800 includes a processor unit 1802 comprising at least one processor (e.g., a central processing unit (CPU), a graphics processing unit (GPU) or both, processor cores, compute nodes, etc.). The architecture 1800 may further comprise a main memory 1804 and a static memory 1806, which communicate with each other via a link 1808 (e.g., bus). The architecture 1800 can further include a video display unit 1810, an alphanumeric input device 1812 (e.g., a keyboard), and a UI navigation device 1814 (e.g., a mouse). In some examples, the video display unit 1810, input device 1812, and UI navigation device 1814 are incorporated into a touch screen display. The architecture 1800 may additionally include a storage device 1816 (e.g., a drive unit), a signal generation device 1818 (e.g., a speaker), a network interface device 1820, and one or more sensors (not shown), such as a global positioning system (GPS) sensor, compass, accelerometer, or other sensor.

In some examples, the processor unit 1802 or other suitable hardware component may support a hardware interrupt. In response to a hardware interrupt, the processor unit 1802 may pause its processing and execute an ISR, for example, as described herein.

The storage device 1816 includes a machine-readable medium 1822 on which is stored one or more sets of data structures and instructions 1824 (e.g., software) embodying or utilized by any one or more of the methodologies or functions described herein. The instructions 1824 can also reside, completely or at least partially, within the main memory 1804, static memory 1806, and/or within the processor unit 1802 during execution thereof by the architecture 1800, with the main memory 1804, static memory 1806, and the processor unit 1802 also constituting machine-readable media. Instructions stored at the machine-readable medium 1822 may include, for example, instructions for implementing the software architecture 1702, instructions for executing any of the features described herein, etc.

While the machine-readable medium 1822 is illustrated in an example to be a single medium, the term "machine-readable medium" can include a single medium or multiple media (e.g., a centralized or distributed database, and/or associated caches and servers) that store the one or more instructions 1824. The term "machine-readable medium" shall also be taken to include any tangible medium that is capable of storing, encoding, or carrying instructions for execution by the machine and that cause the machine to perform any one or more of the methodologies of the present disclosure or that is capable of storing, encoding or carrying data structures utilized by or associated with such instructions. The term "machine-readable medium" shall accordingly be taken to include, but not be limited to, solid-state memories, and optical and magnetic media. Specific examples of machine-readable media include non-volatile memory, including, but not limited to, by way of example, semiconductor memory devices (e.g., electrically programmable read-only memory (EPROM), electrically erasable programmable read-only memory (EEPROM)) and flash memory devices; magnetic disks such as internal hard disks and removable disks; magneto-optical disks; and CD-ROM and DVD-ROM disks.

The instructions 1824 can further be transmitted or received over a communications network 1826 using a transmission medium via the network interface device 1820 utilizing any one of a number of well-known transfer protocols (e.g., Hyper Text Transfer Protocol (HTTP)). Examples of communication networks include a LAN, a WAN, the Internet, mobile telephone networks, plain old telephone (POTS) networks, and wireless data networks (e.g., Wi-Fi, 3G, and 5G LTE/LTE-A or WiMAX networks). The term "transmission medium" shall be taken to include any intangible medium that is capable of storing, encoding, or carrying instructions for execution by the machine, and includes digital or analog communications signals or other intangible medium to facilitate communication of such software.

The above detailed description includes references to the accompanying drawings, which form a part of the detailed description. The drawings show, by way of illustration, specific example embodiments in which the disclosure can be practiced. These example embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein. In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like. The above description is intended to be illustrative, and not restrictive. For example, the above-described examples (or one or more aspects thereof) may be used in combination with each other. Other example embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed example embodiment. Thus, the following claims are hereby incorporated into the Detailed Description as examples or example embodiments, with each claim standing on its own as a separate example embodiment, and it is contemplated that such example embodiments can be combined with each other in various combinations or permutations. The scope of the disclosure should be determined with reference to the appended claims, along with the full scope of equivalents to which such claims are entitled.

EXAMPLES

Example 1 is a system for evaluating electronic components, the system comprising: a server computing device comprising a processor unit and configured to execute an evaluation application, wherein the evaluation application is configured to perform operations comprising: providing an evaluation user interface to a user application executing at a user computing device; receiving an indication of an electronic component for evaluation from the user application and via the user interface; accessing a configuration data set for the electronic component, wherein the configuration data set comprises: argument data describing a set of arguments for the electronic component; binding data describing a relationship between a first argument of the set of arguments and a first model input parameter; and simulator data describing a model for the electronic component; and evaluating the electronic component based at least in part on the configuration data set.

In Example 2, the subject matter of Example 1 optionally includes wherein the configuration data set further comprises first bundle data describing a first bundle comprising a subset of arguments of the set of arguments, wherein the evaluation application is further configured to perform operations comprising: determining that the first bundle is enabled; and providing, to the user, application field description data describing a component of the user interface for receiving values for the subset of arguments.

In Example 3, the subject matter of any one or more of Examples 1-2 optionally includes wherein the evaluation application is further configured to perform operations comprising: receiving signal chain data from the user application, wherein the signal chain data describes the electronic component and an analysis; receiving a data stream; and initiating an analysis to generate evaluation output data from the data stream.

In Example 4, the subject matter of Example 3 optionally includes wherein the evaluation output data comprises plot data describing a first model output parameter versus time.

In Example 5, the subject matter of any one or more of Examples 3-4 optionally includes wherein the evaluation output data comprises frequency content data describing a frequency content of a first model output parameter.

In Example 6, the subject matter of any one or more of Examples 1-5 optionally includes wherein the evaluation application is further configured to perform operations comprising: receiving a first value for the first argument from the user application and via the user interface; generating a first value for the first model input parameter based at least in part on the first value for the first argument and the binding data; initiating the model for the electronic component based at least in part on the first value for the first model input parameter; and providing, to the user application, evaluation output data for display at the user interface, wherein the evaluation output data is based at least in part on an output of the model.

In Example 7, the subject matter of Example 6 optionally includes wherein initiating the model comprises executing an executable model.

In Example 8, the subject matter of any one or more of Examples 6-7 optionally includes wherein initiating the model comprises initiating a physical model circuit in communication with the server computing device.

In Example 9, the subject matter of any one or more of Examples 6-8 optionally includes wherein the evaluation application is further configured to perform operations comprising: receiving a data stream describing a first model output parameter of the model; selecting a set of frequency spurs of the first model output parameter based at least in part on the first value for the first argument; and determining a power for a first frequency spur of the set of frequency spurs, wherein the evaluation output data comprises power data describing the power for the first frequency spur.

In Example 10, the subject matter of Example 9 optionally includes wherein the electronic component is a converter; and wherein the evaluation application is further configured to perform operations comprising: receiving stimulus signal data describing a stimulus signal for the model; and determining the first frequency spur based at least in part on a fundamental frequency of the stimulus signal and a pre-conversion offset.

In Example 11, the subject matter of any one or more of Examples 9-10 optionally includes wherein the electronic component is a converter; and wherein the evaluation application is further configured to perform operations comprising: receiving stimulus signal data describing a stimulus signal for the model; determining the first frequency spur based at least in part on a fundamental frequency of the stimulus signal; and determining a second frequency spur of the set of frequency spurs based at least in part on the fundamental frequency of the stimulus signal and a multiplier.

In Example 12, the subject matter of any one or more of Examples 9-11 optionally includes wherein the first frequency spur is in a first Nyquist zone; and wherein the evaluation application is further configured to perform operations comprising: determining a second frequency spur of the set of frequency spurs, wherein the second frequency spur is equivalent to the first frequency spur shifted to a second Nyquist zone; determining that a power of the second frequency spur is greater than a noise floor by at least a threshold amount; and writing a description of the second frequency spur to the evaluation output data.

In Example 13, the subject matter of Example 12 optionally includes wherein the first frequency spur is a fundamental frequency of a stimulus signal, wherein a second spur is a harmonic of the fundamental frequency; and wherein the evaluation application is further configured to perform operations comprising: applying an offset to the first frequency spur based at least in part on the first value for the first argument to generate a first offset spur; determining that the first offset spur is greater than the second spur; and writing low frequency warning data to the evaluation output data.

In Example 14, the subject matter of any one or more of Examples 6-13 optionally includes wherein the evaluation application is further configured to perform operations comprising: receiving a data stream describing a first model output parameter of the model; determining that at least a threshold number of values of the first model output parameter described by the data stream correspond to a full-scale value of the electronic component; and writing clipping warning data to the evaluation output data.

In Example 15, the subject matter of any one or more of Examples 6-14 optionally includes wherein electronic component is a converter, and wherein the first value for the first argument indicates a tuning word for a noise shaping feature of the first converter; and wherein the evaluation application is further configured to perform operations comprising: determining an ideal band for the electronic component; determining that the tuning word is outside of the ideal band; and writing improper noise shaping data to the evaluation output data.

Example 16 is a method for evaluating electronic components, the method comprising: providing, by a server computing device, an evaluation user interface to a user application executing at a user computing device; receiving, by the server computing device, an indication of an electronic component for evaluation from the user application and via the user interface; accessing, by the server computing device, a configuration data set for the electronic component, wherein the configuration data set comprises: argument data describing a set of arguments for the electronic component; binding data describing a relationship between a first argument of the set of arguments and a first model input parameter; and simulator data describing a model for the electronic component; and evaluating, by the server computing device, the electronic component based at least in part on the configuration data set.

In Example 17, the subject matter of Example 16 optionally includes receiving, by the server computing device, a first value for the first argument from the user application and via the user interface; generating, by the server computing device, a first value for the first model input parameter based at least in part on the first value for the first argument and the binding data; initiating, by the server computing device, the model for the electronic component based at least in part on the first value for the first model input parameter; and providing, to the user application by the server computing device, evaluation output data for display at the user interface, wherein the evaluation output data is based at least in part on an output of the model.

In Example 18, the subject matter of any one or more of Examples 16-17 optionally includes receiving, by the server computing device, a data stream describing a first model output parameter of the model; selecting, by the server computing device, a set of frequency spurs of the first model output parameter based at least in part on the first value for the first argument; and determining, by the server computing device, a power for a first frequency spur of the set of frequency spurs, wherein the evaluation output data comprises power data describing the power for the first frequency spur.

Example 19 is a machine-readable medium comprising instructions thereon that, when executed by a computing device, cause the computing device to perform operations comprising: providing an evaluation user interface to a user application executing at a user computing device; receiving an indication of an electronic component for evaluation from the user application and via the user interface; accessing a configuration data set for the electronic component, wherein the configuration data set comprises: argument data describing a set of arguments for the electronic component; binding data describing a relationship between a first argument of the set of arguments and a first model input parameter; and simulator data describing a model for the electronic component; and evaluating the electronic component based at least in part on the configuration data set.

In Example 20, the subject matter of Example 19 optionally includes instructions thereon that, when executed by a computing device, cause the computing device to perform operations comprising: receiving a first value for the first argument from the user application and via the user interface; generating a first value for the first model input parameter based at least in part on the first value for the first argument and the binding data; initiating the model for the electronic component based at least in part on the first value for the first model input parameter; and providing, to the user application, evaluation output data for display at the user interface, wherein the evaluation output data is based at least in part on an output of the model.

What is claimed is:

1. A system for evaluating an electronic component, the system comprising:
   a server computing device comprising a processor unit and configured to execute an evaluation application, wherein the evaluation application is configured to perform operations comprising:
   providing a user interface to a user application executing at a user computing device;
   receiving an indication of a first signal chain, the first signal chain comprising a signal generator and a first component simulator for modeling the electronic component, the indication of the first signal chain received from the user application and via the user interface;
   accessing a configuration data set for the first signal chain, wherein the configuration data set comprises:
   argument data describing a set of arguments for the signal generator and the first component simulator;
   binding data describing a relationship between a first argument of the set of arguments and a model input parameter of a first model for the electronic component, the binding data also describing a relationship between the first argument of the set of arguments and a model input parameter of a second model for the electronic component different than the first model; and
   simulator data describing at least the first model for the electronic component;
   executing an implementation of the signal generator to generate a stimulus signal:
   selecting the first model for evaluation of the electronic component;
   determining a value for the model input parameter of the first model using the argument data and the binding data at least in part by performing a transformation on the argument data, the transformation being based on the relationship between the first argument of the set of arguments and the model input parameter of the first model described by the binding data;
   using the first component simulator to evaluate the electronic component at least in part by executing the first model for the electronic component to generate an electronic component output, the evaluating based at least in part on the stimulus signal and the value for the model input parameter of the first model;
   executing at least one data analyzer to generate first signal chain result data using the electronic component output; and
   providing the first signal chain result data to the user computing device via the user interface.

2. The system of claim 1, wherein the configuration data set further comprises first bundle data describing a first bundle comprising a subset of arguments of the set of arguments, wherein the evaluation application is further configured to perform operations comprising:
   determining that the first bundle is enabled; and
   providing, to the user application, field description data describing a component of the user interface for receiving values for the subset of arguments.

3. The system of claim 1, wherein the first signal chain result data comprises plot data describing a model output parameter versus time.

4. The system of claim 1, wherein the first signal chain result data comprises frequency content data describing a frequency content of a model output parameter.

5. The system of claim 1, wherein the evaluation application is further configured to perform operations comprising:
   receiving a first value for the first argument from the user application and via the user interface;
   generating a first value for the model input parameter based at least in part on the first value for the first argument and the binding data;
   initiating the first model for the electronic component based at least in part on the first value for the model input parameter; and providing, to the user application, evaluation output data for display at the user interface, wherein the evaluation output data is based at least in part on an output of the first model.

6. The system of claim 5, wherein initiating the first model comprises executing an executable model.

7. The system of claim 5, wherein initiating the first model comprises initiating a physical model circuit in communication with the server computing device.

8. The system of claim 5, wherein the evaluation application is further configured to perform operations comprising:
receiving a data stream describing a model output parameter of the first model;
selecting a set of frequency spurs of the model output parameter based at least in part on the first value for the first argument; and
determining a power for a first frequency spur of the set of frequency spurs, wherein the evaluation output data comprises power data describing the power for the first frequency spur.

9. The system of claim 8, wherein the electronic component is a converter; and wherein the evaluation application is further configured to perform operations comprising:
receiving stimulus signal data describing a stimulus signal for the first model; and
determining the first frequency spur based at least in part on a fundamental frequency of the stimulus signal and a pre-conversion offset.

10. The system of claim 8, wherein the electronic component is a converter, and wherein the evaluation application is further configured to perform operations comprising:
receiving stimulus signal data describing a stimulus signal for the first model;
determining the first frequency spur based at least in part on a fundamental frequency of the stimulus signal; and
determining a second frequency spur of the set of frequency spurs based at least in part on the fundamental frequency of the stimulus signal and a multiplier.

11. The system of claim 8, wherein the first frequency spur is in a first Nyquist zone; and
wherein the evaluation application is further configured to perform operations comprising:
determining a second frequency spur of the set of frequency spurs, wherein the second frequency spur is equivalent to the first frequency spur shifted to a second Nyquist zone;
determining that a power of the second frequency spur is greater than a noise floor by at least a threshold amount; and
writing a description of the second frequency spur to the evaluation output data.

12. The system of claim 11, wherein the first frequency spur is a fundamental frequency of a stimulus signal, wherein a second spur is a harmonic of the fundamental frequency; and
wherein the evaluation application is further configured to perform operations comprising:
applying an offset to the first frequency spur based at least in part on the first value for the first argument to generate a first offset spur;
determining that the first offset spur is greater than the second spur; and
writing low frequency warning data to the evaluation output data.

13. The system of claim 5, wherein the evaluation application is further configured to perform operations comprising:
receiving a data stream describing a model output parameter of the first model,
determining that at least a threshold number of values of the model output parameter described by the data stream correspond to a full-scale value of the electronic component; and
writing clipping warning data to the evaluation output data.

14. The system of claim 5, wherein electronic component is a converter, and wherein the first value for the first argument indicates a tuning word for a noise shaping feature of the converter; and
wherein the evaluation application is further configured to perform operations comprising:
determining an ideal band for the electronic component;
determining that the tuning word is outside of the ideal band: and
writing improper noise shaping data to the evaluation output data.

15. A method for evaluating an electronic component, the method comprising:
providing, by a server computing device, a user interface to a user application executing at a user computing device;
receiving, by the server computing device, an indication of a first signal chain, the first signal chain comprising a signal generator and a first component simulator for modeling the electronic component, the indication of the first signal chain received from the user application and via the user interface;
accessing, by the server computing device, a configuration data set for the first signal chain, wherein the configuration data set comprises:
argument data describing a set of arguments for the signal generator and the first component simulator;
binding data describing a relationship between a first argument of the set of arguments and a model input parameter of a first model for the electronic component, the binding data also describing a relationship between the first argument of the set of arguments and a model input parameter of a second model for the electronic component different than the first model; and
simulator data describing at least the first model for the electronic component;
executing an implementation of the signal generator to generate a stimulus signal;
selecting the first model for evaluation of the electronic component;
determining a value for the model input parameter of the first model using the argument data and the binding data at least in part by performing a transformation on the argument data, the transformation being based on the relationship between the first argument of the set of arguments and the model input parameter of the first model described by the binding data;
using the first component simulator, by the server computing device, to evaluate the electronic component, at least in part by executing the first model for the electronic component to generate an electronic component output, the evaluating based at least in part on the stimulus signal and the value for the model input parameter of the first model;

executing at least one data analyzer to generate first signal chain result data using the electronic component output; and providing the first signal chain result data to the user computing device via the user interface.

16. The method of claim 15, further comprising:

receiving, by the server computing device, a first value for the first argument from the user application and via the user interface;

generating, by the server computing device, a first value for the model input parameter based at least in part on the first value for the first argument and the binding data;

initiating, by the server computing device, the first model for the electronic component based at least in part on the first value for the model input parameter; and providing, to the user application by the server computing device, evaluation output data for display at the user interface, wherein the evaluation output data is based at least in part on an output of the first model.

17. The method of claim 16, further comprising:

receiving, by the server computing device, a data stream describing a first model output parameter of the first model;

selecting, by the server computing device, a set of frequency spurs of the first model output parameter based at least in part on the first value for the first argument; and determining, by the server computing device, a power for a first frequency spur of the set of frequency spurs, wherein the evaluation output data comprises power data describing the power for the first frequency spur.

18. A non-transitory machine-readable medium comprising instructions thereon that, when executed by a computing device, cause the computing device to perform operations comprising:

providing a user interface to a user application executing at a user computing device;

receiving an indication of a first signal chain, the first signal chain comprising a signal generator and a first component simulator for modeling an electronic component, the indication of the first signal chain received from the user application and via the user interface;

accessing a configuration data set for the first signal chain, wherein the configuration data set comprises:

argument data describing a set of arguments for the signal generator and the first component simulator;

binding data describing a relationship between a first argument of the set of arguments and a model input parameter of a first model for the electronic component, the binding data also describing a relationship between the first argument of the set of arguments and a model input parameter of a second model for the electronic component different than the first model; and simulator data describing at least the first model for the electronic component;

executing an implementation of the signal generator to generate a stimulus signal:

selecting the first model for evaluation of the electronic component;

determining a value for the model input parameter of the first model using the argument data and the binding data at least in part by performing a transformation on the argument data, the transformation being based on the relationship between the first argument of the set of arguments and the model input parameter of the first model described by the binding data;

using the first component simulator to evaluate the electronic component at least in part by executing the first model for the electronic component to generate an electronic component output, the evaluating based at least in part on the stimulus signal and the value for the model input parameter of the first model;

executing at least one data analyzer to generate first signal chain result data using the electronic component output; and providing the first signal chain result data to the user computing device via the user interface.

19. The medium of claim 18, further comprising instructions thereon that, when executed by a computing device, cause the computing device to perform operations comprising:

receiving a first value for the first argument from the user application and via the user interface;

generating a first value for the model input parameter based at least in part on the first value for the first argument and the binding data;

initiating the first model for the electronic component based at least in part on the first value for the model input parameter; and providing, to the user application, evaluation output data for display at the user interface, wherein the evaluation output data is based at least in part on an output of the first model.

* * * * *